United States Patent
Kobayashi et al.

(10) Patent No.: US 11,865,665 B2
(45) Date of Patent: Jan. 9, 2024

(54) POLISHING APPARATUS

(71) Applicant: EBARA CORPORATION, Tokyo (JP)

(72) Inventors: Kenichi Kobayashi, Tokyo (JP);
Masayuki Nakanishi, Tokyo (JP);
Makoto Kashiwagi, Tokyo (JP);
Manao Hoshina, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1393 days.

(21) Appl. No.: 16/163,070

(22) Filed: Oct. 17, 2018

(65) Prior Publication Data
US 2019/0118335 A1  Apr. 25, 2019

(30) Foreign Application Priority Data

Oct. 25, 2017  (JP) ................. 2017-206648

(51) Int. Cl.
*H01L 21/02* (2006.01)
*H01L 21/67* (2006.01)
(Continued)

(52) U.S. Cl.
CPC ............ *B24B 37/042* (2013.01); *B24B 7/228* (2013.01); *B24B 21/004* (2013.01);
(Continued)

(58) Field of Classification Search
CPC . B24B 21/004; B24B 37/005; H01L 21/0209; H01L 21/67051; H01L 21/68742; H01L 21/68764
See application file for complete search history.

(56) References Cited

U.S. PATENT DOCUMENTS

| 6,343,978 | B1* | 2/2002 | Shimizu ............ H01L 21/67173 451/63 |
| 7,938,130 | B2 | 5/2011 | Kaneko et al. |

(Continued)

FOREIGN PATENT DOCUMENTS

| CN | 102473626 A | 5/2012 |
| CN | 103962941 A | 8/2014 |

(Continued)

OTHER PUBLICATIONS

European Patent Application No. 18202150.1; Extended Search Report; dated Feb. 21, 2019; 9 pages.

*Primary Examiner* — Keath T Chen
*Assistant Examiner* — Margaret Klunk
(74) *Attorney, Agent, or Firm* — BakerHostetler

(57) ABSTRACT

A polishing apparatus which can efficiently polish an entirety of a back surface of a substrate, with the back surface facing downward, is disclosed. The polishing apparatus includes: a substrate holder configured to rotate the substrate; a polishing head configured to polish the back surface of the substrate; a tape advancing device; and a translational rotating mechanism configured to cause the polishing head to make a translational rotating motion. The substrate holder includes a plurality of rollers which are rotatable about their own axes. The plurality of rollers have substrate-holding surfaces capable of contacting a periphery of the substrate. The polishing head is disposed below the substrate-holding surfaces. The polishing head includes a polishing blade configured to press the polishing tape against the back surface of the substrate, and a pressing mechanism configured to push the polishing blade upward.

16 Claims, 34 Drawing Sheets

(51) Int. Cl.
    *B24B 37/005*     (2012.01)
    *H01L 21/687*     (2006.01)
    *B24B 21/00*     (2006.01)
    *B24B 37/04*     (2012.01)
    *B24B 21/10*     (2006.01)
    *B24B 37/30*     (2012.01)
    *B24B 41/06*     (2012.01)
    *B24B 7/22*     (2006.01)
    *B24B 37/10*     (2012.01)

(52) U.S. Cl.
    CPC ............ *B24B 21/008* (2013.01); *B24B 21/10* (2013.01); *B24B 37/005* (2013.01); *B24B 37/105* (2013.01); *B24B 37/30* (2013.01); *B24B 41/067* (2013.01); *H01L 21/0209* (2013.01); *H01L 21/67034* (2013.01); *H01L 21/67051* (2013.01); *H01L 21/68728* (2013.01); *H01L 21/68742* (2013.01); *H01L 21/68764* (2013.01)

(56) References Cited

U.S. PATENT DOCUMENTS

| | | | |
|---|---|---|---|
| 8,578,953 B2 | 11/2013 | Takiguchi et al. | |
| 2002/0098787 A1* | 7/2002 | Kunisawa | B24B 49/12 451/307 |
| 2009/0017730 A1* | 1/2009 | Kubota | B24B 9/065 451/41 |
| 2010/0178851 A1* | 7/2010 | Nakanishi | B24B 9/065 451/307 |
| 2013/0213437 A1* | 8/2013 | Ishii | B08B 1/001 15/97.1 |
| 2015/0000056 A1* | 1/2015 | Togawa | H01L 21/67051 15/97.1 |
| 2018/0277401 A1* | 9/2018 | Watanabe | H01L 22/20 |

FOREIGN PATENT DOCUMENTS

| | | |
|---|---|---|
| JP | H08-161738 A | 6/1996 |
| JP | 2002-208572 A | 7/2002 |
| JP | 2003-080451 A | 3/2003 |
| JP | 2013-172019 A | 9/2013 |
| JP | 2014-017472 A | 1/2014 |
| JP | 2015-012200 A | 1/2015 |
| JP | 2017-148931 A | 8/2017 |
| TW | 200800488 A | 1/2008 |
| WO | WO 2002/002270 A1 | 1/2002 |
| WO | WO-0202270 A1 * | 1/2002 ........... B24B 21/004 |

* cited by examiner

POLISHING APPARATUS

CROSS REFERENCE TO RELATED APPLICATION

This document claims priority to Japanese Patent Application Number 2017-206648 filed Oct. 25, 2017, the entire contents of which are hereby incorporated by reference.

BACKGROUND

The present invention relates to a polishing apparatus for a substrate such as a wafer.

Devices such as memory circuits, logic circuits and image sensors (e.g. CMOS sensors) are becoming more highly integrated these days. In a process for forming such a device, foreign matters such as fine particles and dust may adhere to the device. Foreign matter adhering to a device can cause a short-circuit between interconnects or a circuit defect. Therefore, in order to enhance the reliability of the device, it is necessary to clean a wafer on which the device is formed to remove the foreign matter on the wafer.

The above-described foreign matters, such as fine particles and dust, may adhere also to a back surface (non-device surface) of a wafer. When such foreign matter adheres to the back surface of a wafer, the wafer may separate from a stage reference surface, or a front surface of the wafer may be inclined with respect to the stage reference surface in an exposure apparatus, resulting in patterning deviation or deviation of focal distance. To prevent such problems, it is necessary to remove foreign matter adhering to a back surface of a wafer.

CITATION LIST

Patent Literature

Patent document 1: Japanese Patent Laid-Open Publication No. 2015-12200

A conventional polishing unit performs polishing of a wafer surface while rotating the wafer by means of a substrate rotating mechanism (see, for example, Japanese Patent Laid-Open Publication No. 2015-12200). The substrate rotating mechanism includes a plurality of chucks for holding the periphery of the wafer, and an annular hollow motor for rotating the wafer via the chucks. The wafer is held horizontally, with its to-be-polished surface facing upward, by the chucks, and is rotated together with the chucks about the axis of the wafer by the hollow motor. A polishing head, which is equipped with a polishing tool, is disposed above the wafer and, in addition, disposed inside the periphery of the wafer, held by the chucks, so that the polishing head will not contact the rotating chucks. Accordingly, the outermost area of the wafer surface is not polished, and needs to be separately polished with use of an edge-polishing unit.

The above polishing unit is provided, for example, in a substrate processing unit which can perform a sequence of processing steps including polishing, cleaning and drying of a wafer surface. In such a substrate processing system, a plurality of wafers are housed, with their back surfaces facing downward, in a wafer cassette. Therefore, when a back surface of a wafer is to be polished in the polishing unit, the wafer needs to be reversed in advance while the wafer is transported from the wafer cassette to the polishing unit. Further, the polished wafer needs to be reversed again before returning the wafer to the wafer cassette. When a wafer is thus reversed, impurities in the air are likely to adhere to the wafer. Furthermore, the repeated reversal of the wafer results in an increase in an overall processing time. In addition, a reversing machine for reversing a wafer is required in the substrate processing system, thus leading to a complicated construction.

SUMMARY OF THE INVENTION

The present invention has been made to solve the above-described problems of the prior art. It is therefore an object of the present invention to provide a polishing apparatus which can efficiently polish an entirety of a back surface, including an outermost area, of a substrate, with the back surface facing downward.

In an embodiment, there is provided a polishing apparatus comprising: a substrate holder configured to hold a substrate and rotate the substrate, the substrate holder including a plurality of rollers which are rotatable about their own axes, the plurality of rollers having substrate-holding surfaces capable of contacting a periphery of the substrate; a polishing head configured to bring a polishing tape, having abrasive particles on one surface, into contact with a back surface of the substrate to polish the back surface, the polishing head being disposed below the substrate-holding surfaces, the polishing head including a polishing blade configured to press the polishing tape against the back surface of the substrate, and a pressing mechanism configured to push the polishing blade upward; a tape advancing device configured to advance the polishing tape in its longitudinal direction; and a translational rotating mechanism configured to cause the polishing head to make a translational rotating motion.

In an embodiment, the polishing blade extends obliquely with respect to an advancing direction of the polishing tape.

In an embodiment, the polishing head includes a spherical bearing which tiltably supports the polishing blade.

In an embodiment, the polishing head has a soft material that covers a top edge of the polishing blade.

In an embodiment, the polishing blade is longer than a radius of the substrate.

In an embodiment, the polishing blade comprises a plurality of polishing blades, and the pressing mechanism comprises a plurality of pressing mechanisms which are configured to be capable of operating independently of each other.

In an embodiment, the polishing blades are arranged in a line.

In an embodiment, an entirety of the polishing blades is longer than a radius of the substrate.

In an embodiment, the polishing blades are located at different distances from an axis of the substrate holder.

In an embodiment, the polishing apparatus further comprises a polishing-head moving mechanism configured to translate the polishing head.

In an embodiment, there is provided a polishing apparatus comprising: a substrate holder configured to hold a substrate and rotate the substrate, the substrate holder including a plurality of rollers which are rotatable about their own axes, the plurality of rollers having substrate-holding surfaces capable of contacting a periphery of the substrate; a polishing head configured to bring a polishing tool into contact with a back surface of the substrate to polish the back surface, the polishing head being disposed below the substrate-holding surfaces, the polishing head including a pressing mechanism configured to push the polishing tool upward; and a translational rotating mechanism configured to cause the substrate holder to make a translational rotating motion.

In an embodiment, the polishing tool is a polishing tape having abrasive particles on one surface thereof, the polishing apparatus further comprises a tape advancing device configured to advance the polishing tape in its longitudinal direction, the polishing head further includes a polishing blade arranged to press the polishing tape against the back surface of the substrate, and the pressing mechanism is coupled to the polishing blade so that the pressing mechanism pushes the polishing blade upward.

In an embodiment, the polishing blade extends obliquely with respect to an advancing direction of the polishing tape.

In an embodiment, the polishing head includes a spherical bearing which tiltably supports the polishing blade.

In an embodiment, the polishing head has a soft material that covers a top edge of the polishing blade.

In an embodiment, the polishing blade is longer than a diameter of the substrate.

In an embodiment, the polishing blade comprises a plurality of polishing blades, and the pressing mechanism comprises a plurality of pressing mechanisms which are configured to be capable of operating independently of each other.

In an embodiment, the polishing blades are arranged in a line.

In an embodiment, an entirety of the polishing blades is longer than a diameter of the substrate.

In an embodiment, the polishing blades are located at different distances from an axis of the substrate holder.

In an embodiment, the polishing tool comprises a plurality of polishing tools, and the pressing mechanism comprises a plurality of pressing mechanisms which are configured to be capable of operating independently of each other.

In an embodiment, the polishing head comprises a plurality of polishing heads.

In an embodiment, there is provided a polishing apparatus comprising: a substrate holder configured to hold a substrate and rotate the substrate, the substrate holder including a plurality of rollers which are rotatable about their own axes, the plurality of rollers having substrate-holding surfaces capable of contacting a periphery of the substrate; a polishing head configured to bring a polishing tool into contact with a back surface of the substrate to polish the back surface, the polishing head being disposed below the substrate-holding surfaces; and a Bernoulli chuck configured to attract the back surface of the substrate with a fluid in a non-contact manner, the Bernoulli chuck being disposed below the substrate-holding surfaces.

In an embodiment, the polishing apparatus further comprises a translational rotating mechanism configured to cause the polishing head to make a translational rotating motion.

In an embodiment, the polishing apparatus further comprises a translational rotating mechanism configured to cause the substrate holder to make a translational rotating motion.

According to the present invention, an entirety of a back surface, including an outermost area, of a substrate can be polished without contact of the polishing head with the substrate holder. This eliminates the need to polish the outermost area of the back surface of the substrate by using an edge-polishing unit, and can therefore reduce the number of polishing steps. Further, according to the present invention, there is no need to reverse a substrate. This can prevent impurities in the air from adhering to the substrate and can reduce the overall processing time. Moreover, because of no need for an edge-polishing unit and a reversing machine for reversing a substrate, a construction of a substrate processing system can be simplified and the cost can be reduced.

Further, according to the present invention, the polishing head is disposed below a substrate, and the polishing apparatus polishes the back surface of the substrate while causing the polishing head or the substrate holder to make a translational rotating motion. This operation can ensure a significant relative speed between the polishing tool and the substrate. In particular, the translational rotating motion can ensure a sufficiently high relative speed between the substrate and the polishing tool at the center of the substrate. As a result, the polishing apparatus can efficiently polish the back surface of the substrate, with the back surface facing downward.

DESCRIPTION OF EMBODIMENTS

Figure 1:
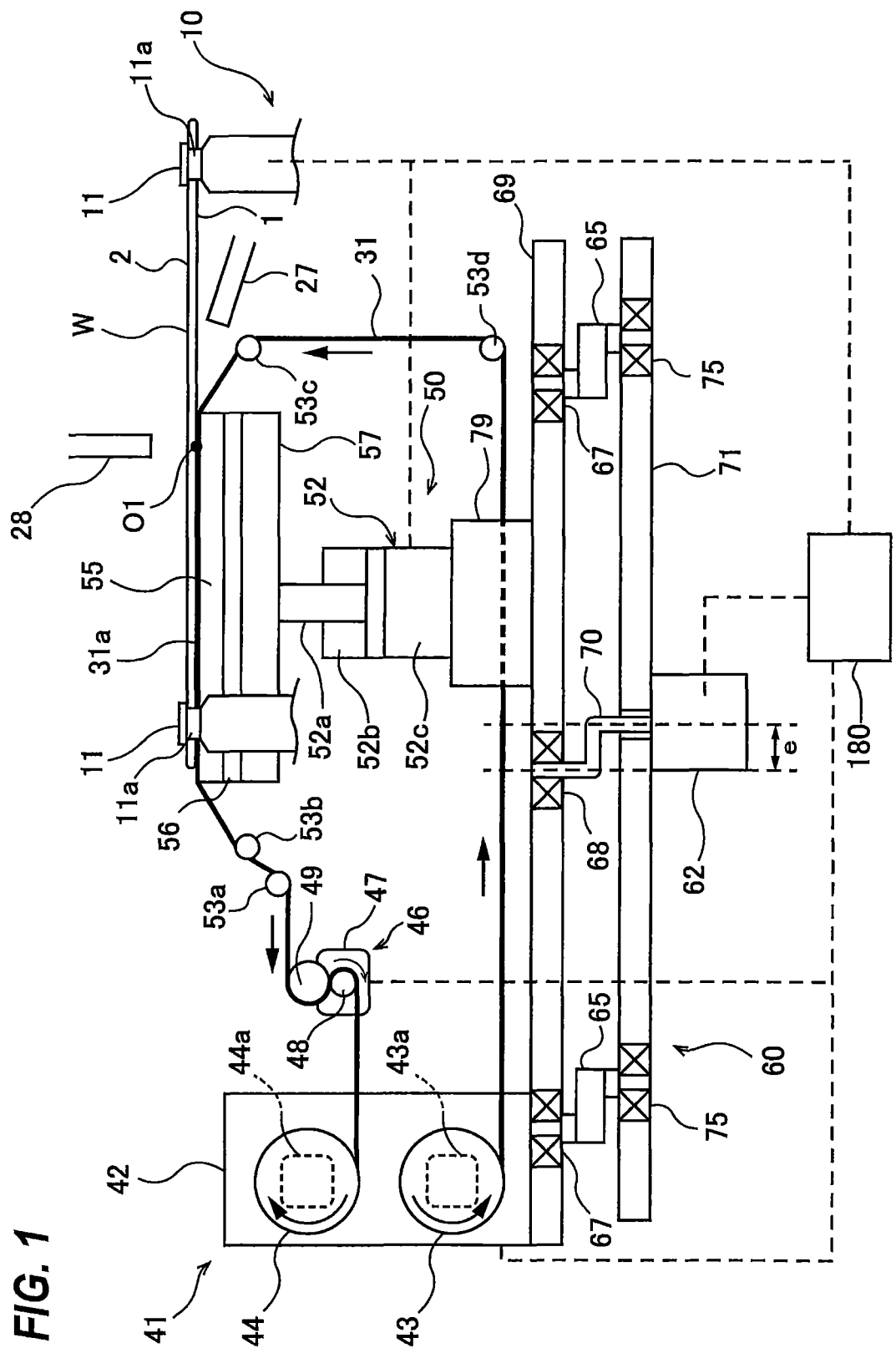
FIG. 1 is a schematic view showing an embodiment of a polishing apparatus.

Embodiments of the present invention will now be described with reference to the drawings. FIG. 1 is a schematic view showing an embodiment of a polishing apparatus. The polishing apparatus shown in FIG. 1 includes a substrate holder 10 for holding a wafer W, which is an example of a substrate, and rotating the wafer W about its axis, a polishing head 50 for bringing a polishing tape 31, as a polishing tool, into contact with a first surface 1 of the wafer W, held by the substrate holder 10, to polish the first surface 1, a polishing-tape supply mechanism 41 for supplying the polishing tape 31 to the polishing head 50, and a translational rotating mechanism 60 for causing the polishing head 50 and the polishing-tape supply mechanism 41 to make a translational rotating motion.

The substrate holder 10 includes a plurality of rollers 11 which can contact a periphery of the wafer W. The polishing head 50 is disposed at a lower side of the wafer W held by the substrate holder 10. The translational rotating mechanism 60 is disposed below the polishing head 50 and the polishing-tape supply mechanism 41. The polishing head 50 and the polishing-tape supply mechanism 41 are coupled to the translational rotating mechanism 60. The depiction of the substrate holder 10 has been partly omitted from FIG. 1.

In this embodiment, the first surface 1 of the wafer W is a back surface of the wafer W, i.e. a non-device surface where no device is formed or no device is to be formed. A second surface 2 of the wafer W, which is an opposite side from the first surface 1, is a front surface, i.e. a device surface where a device(s) is formed or a device(s) is to be formed. In this embodiment, the wafer W, with its first surface 1 facing downward, is horizontally held by the substrate holder 10.

Figure 2:
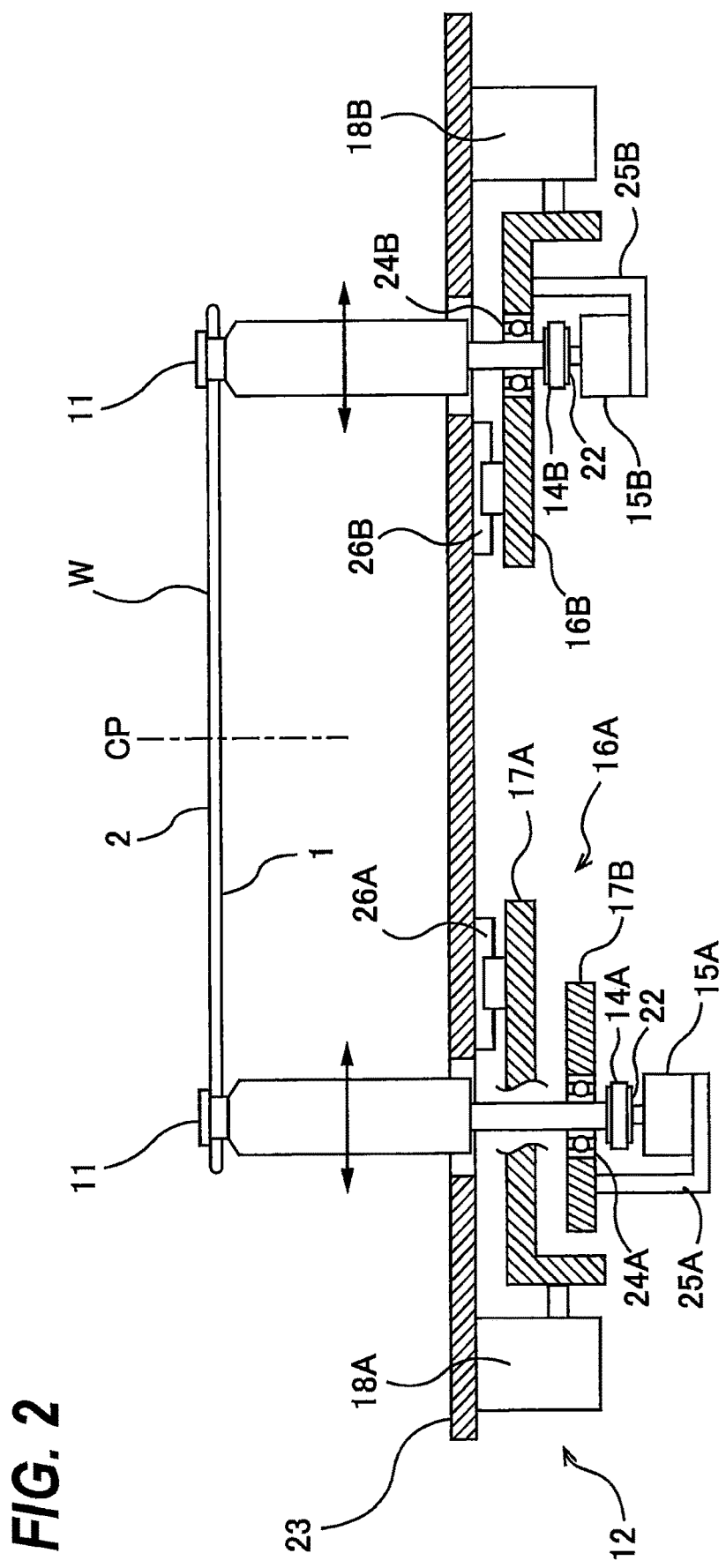
FIG. 2 is a schematic view showing details of a substrate holder.
Figure 3:
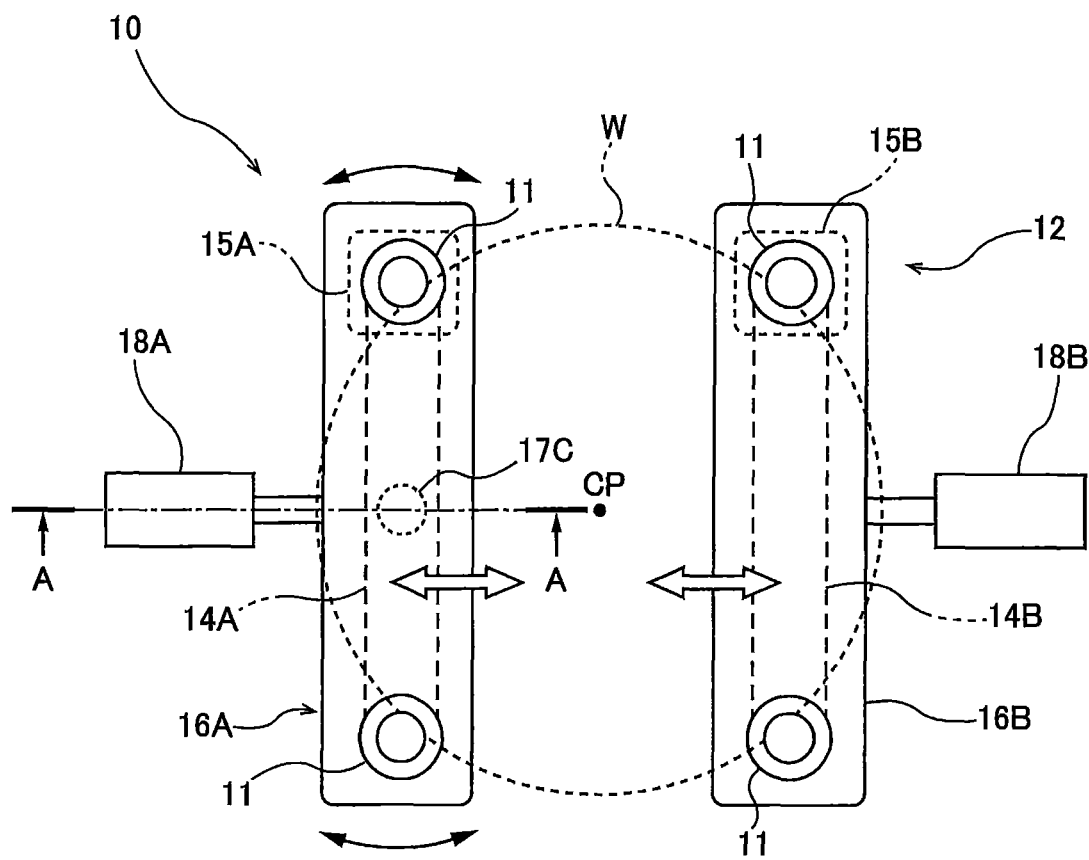
FIG. 3 is a plan view of a roller rotating mechanism shown in FIG. 2.

FIG. 2 is a schematic view showing details of the substrate holder 10, and FIG. 3 is a plan view of a roller rotating mechanism 12 shown in FIG. 2. The substrate holder 10 includes the rollers 11 which can contact the periphery of the wafer W, and the roller rotating mechanism 12 for rotating the rollers 11 about their respective own axes. Four rollers 11 are provided in this embodiment, while five or more rollers 11 may be provided. When the rollers 11 are in contact with the periphery of the wafer W (i.e. when the rollers 11 are holding the wafer W), the rollers 11 are located at the same distance from an axis CP of the substrate holder 10.

The roller rotating mechanism 12 includes a first belt 14A that couples two of the four rollers 11, a first motor 15A coupled to one of the two rollers 11 that are coupled by the first belt 14A, a first motor support 25A that supports the first motor 15A, a first roller base 16A that rotatably supports the two rollers 11 coupled by the first belt 14A, a second belt 14A that couples the other two of the four rollers 11, a second motor 15B coupled to one of the two rollers 11 that are coupled by the second belt 14B, a second motor support 25B that supports the second motor 15B, and a second roller base 16B that rotatably supports, via bearings 24B, the two rollers 11 coupled by the second belt 14B. The first roller base 16A includes an upper first roller base 17A and a lower first roller base 17B. The first motor 15A and the first belt 14A are disposed below the first roller base 16A, and the second motor 15B and the second belt 14B are disposed below the second roller base 16B. The first motor 15A is secured to the first roller base 16A via the first motor support 25A. The second motor 15B is secured to the lower surface of the second roller base 16B via the second motor support 25B.

Figure 4:
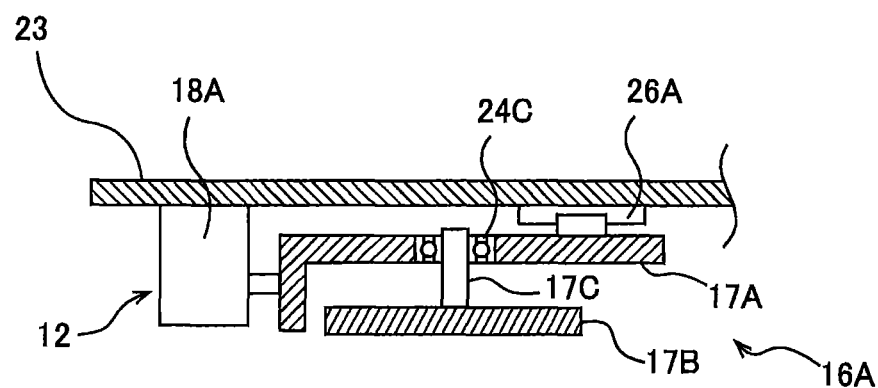
FIG. 4 is a cross-sectional view taken along a line A-A of FIG. 3.

FIG. 4 is a cross-sectional view taken along a line A-A of FIG. 3. As shown in FIG. 4, the first roller base 16A includes the lower first roller base 17B that rotatably supports, via bearings 24A (see FIG. 2), the two rollers 11 coupled by the first belt 14A, a pivot shaft 17C secured to the lower first roller base 17B, and the upper first roller base 17A that rotatably supports the pivot shaft 17C via a bearing 24C. The upper first roller base 17A and the lower first roller base 17B are coupled together by the pivot shaft 17C. As shown in FIG. 3, the pivot shaft 17C is located between the two rollers 11 coupled by the first belt 14A. As shown in FIG. 2, the first motor 15A is secured to the lower surface of the lower first roller base 17B via the first motor support 25A. Accordingly, the first belt 14A, the two rollers 11 coupled by the first belt 14A, the lower first roller base 17B, the first motor 15A, and the first motor support 25A can pivot together on the pivot shaft 17C.

The roller rotating mechanism 12 is configured to rotate the four rollers 11 at the same speed in the same direction. During polishing of the first surface 1 of the wafer W, the periphery of the wafer W is held by the rollers 11. The wafer W is held horizontally, and is rotated about its axis by the rotations of the rollers 11. While the four rollers 11 rotate about their respective axes during polishing of the first surface 1 of the wafer W, the positions of the rollers 11 remain stationary.

A pulley 22 is secured to a lower portion of each of the four rollers 11. The first belt 14A rides on the pulleys 22 secured to two of the four rollers 11, and the second belt 14B rides on the pulleys 22 secured to the other two rollers 11. The first motor 15A and the second motor 15B are configured to rotate at the same speed in the same direction. Accordingly, the four rollers 11 can rotate at the same speed in the same direction.

As shown in FIG. 3, the roller rotating mechanism 12 further includes a first actuator 18A coupled to the upper first roller base 17A of the first roller base 16A, and a second actuator 18B coupled to the second roller base 16B. The first actuator 18A moves the two rollers 11, supported by the first roller base 16A, in a horizontal direction as indicated by the arrow. Similarly, the second actuator 18B moves the other two rollers 11, supported by the second roller base 16B, in a horizontal direction as indicated by the arrow. Thus, the first actuator 18A and the second actuator 18B are configured to move the two sets of rollers 11 (in this embodiment each set consists of two rollers 11) in a direction closer to each other and in a direction away from each other. The first actuator 18A and the second actuator 18B may each be comprised of, for example, an air cylinder or a motor-driven actuator. In the embodiment shown in FIGS. 2 and 3, the first actuator 18A and the second actuator 18B are each comprised of an air cylinder. The first actuator 18A and the second actuator 18B are secured to a lower surface of a base plate 23.

The rollers 11 extend upwardly through the base plate 23. A first linear motion guide 26A and a second linear motion guide 26B are secured to the lower surface of the base plate 23. A movable part of the first linear motion guide 26A is coupled to the upper first roller base 17A, and a movable part of the second linear motion guide 26B is coupled to the second roller base 16B. The two linear motion guides 26A, 26B are configured to restrict movement of the rollers 11 to a linear movement in a horizontal direction.

The two sets of rollers 11 move in a direction closer to each other, until the wafer W is held by the four rollers 11. Since two of the four rollers 11 are pivotable on the pivot shaft 17C, the positions of the two rollers 11 are automatically adjusted when the four rollers 11 are holding the wafer W. The wafer W is released from the four rollers 11 when the two sets of rollers 11 move in a direction away from each other. Though the four rollers 11, arranged around the axis CP of the substrate holder 10, are provided in this embodiment, the number of rollers 11 is not limited to four. For example, it is possible to use three rollers 11, arranged around the axis CP at equal intervals, i.e. 120-degree intervals, and to provide an actuator for each roller 11. In one embodiment, three rollers 11 are arranged around the axis CP at equal angular intervals of 120 degrees, and two of the three rollers 11 are coupled by the first belt 14A. An actuator is provided for the two rollers 11 coupled by the first belt 14A, and another actuator is provided for the remaining roller 11 which is not coupled by the first belt 14A.

Figure 5:
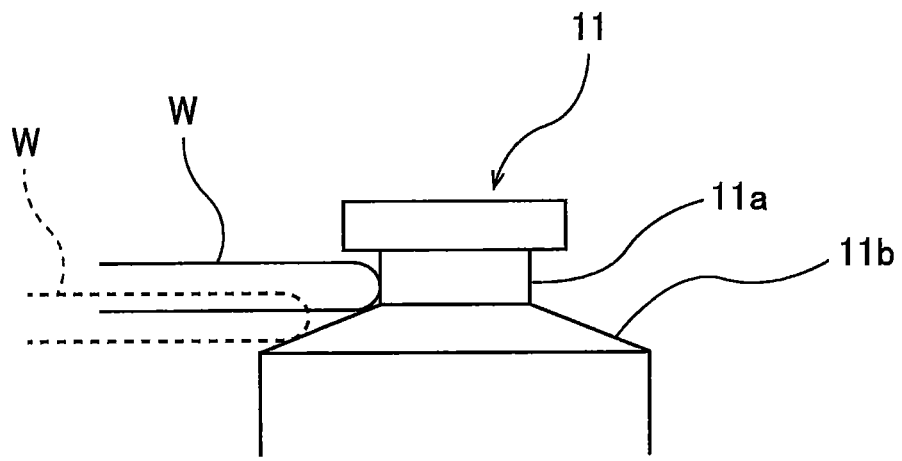
FIG. 5 is an enlarged view of an upper portion of a roller.

FIG. 5 is an enlarged view of a top portion of the roller 11. The roller 11 has a cylindrical substrate-holding surface 11a which is capable of contacting the periphery of the wafer W, and a tapered surface 11b connected to the substrate-holding surface 11a and extending radially outward and obliquely downward from the substrate-holding surface 11a. The tapered surface 11b has a shape of a truncated cone, and has a larger diameter than the substrate-holding surface 11a. The wafer W is first placed on the tapered surfaces 11b of the rollers 11 by a not-shown transport device. Subsequently, the rollers 11 move toward the wafer W, until the periphery of the wafer W is held by the substrate-holding surfaces 11a. When releasing the wafer W, the rollers 11 move away from the wafer W, whereby the periphery of the wafer W leaves the substrate-holding surfaces 11a and is supported by the tapered surfaces 11b (see dotted line of FIG. 5). The not-shown transport device can remove the wafer W from the tapered surfaces 11b.

Figure 6:
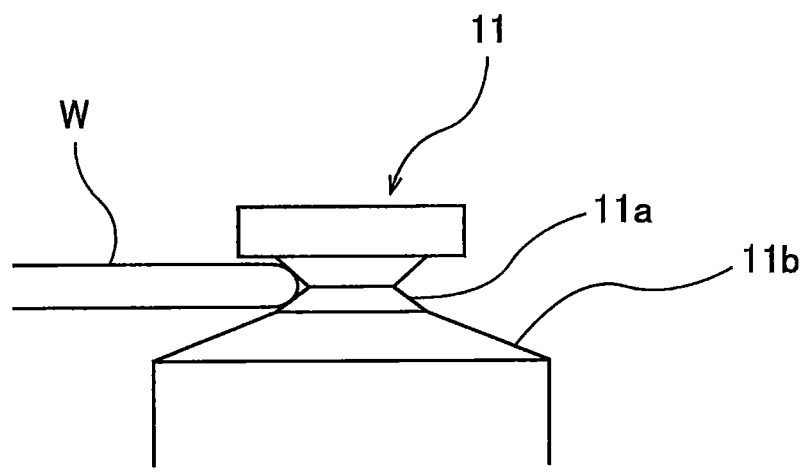
FIG. 6 is a schematic view showing another embodiment of a substrate-holding surface.

In one embodiment, the substrate-holding surface 11a may have an hourglass shape as shown in FIG. 6. Compared to the cylindrical substrate-holding surface 11a shown in FIG. 5, the substrate-holding surface 11a having such an hourglass shape can restrict inclination of the wafer W, and can restrict the vertical height and movement of the wafer W during polishing of the wafer W.

Figure 7:
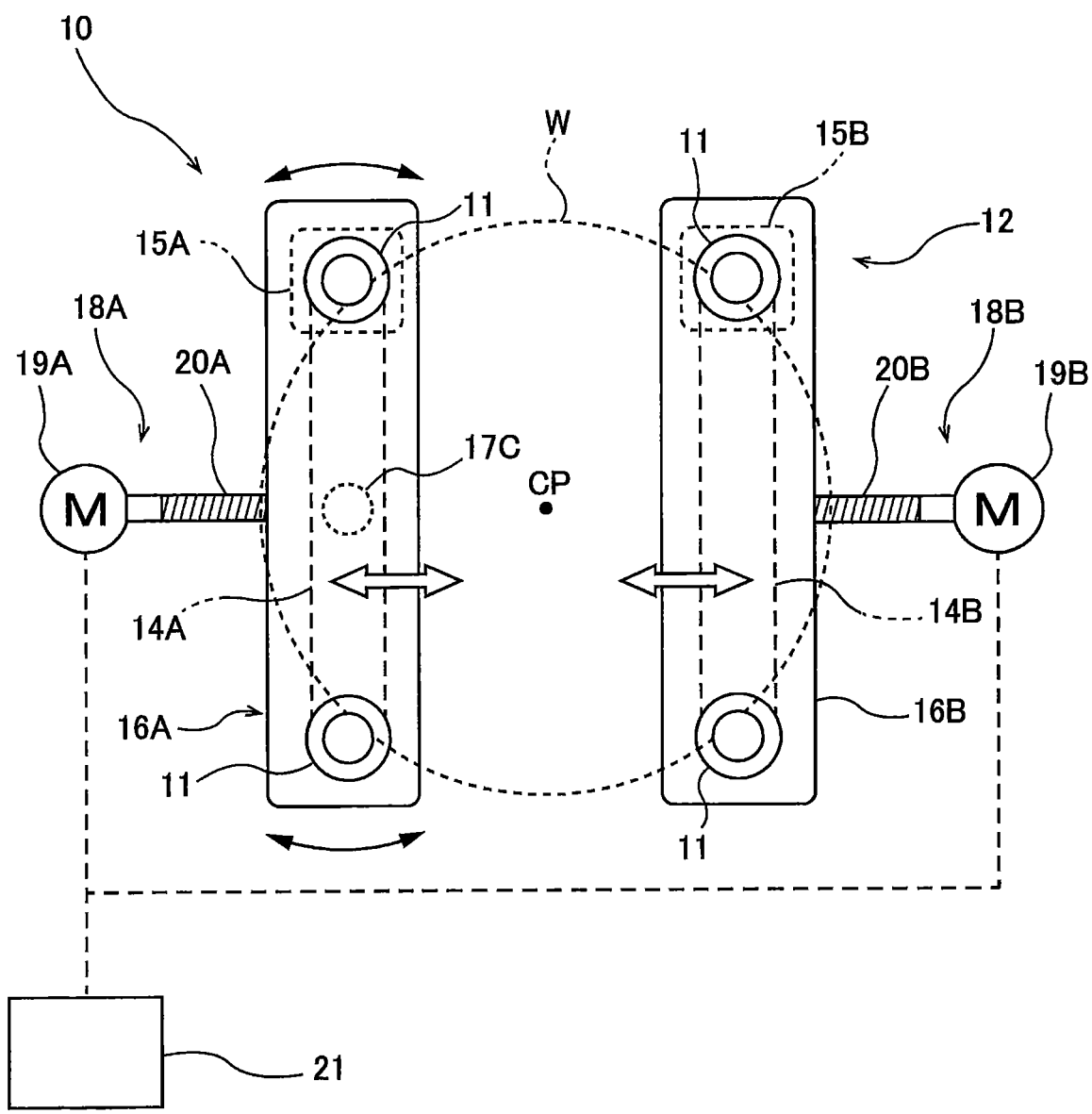
FIG. 7 is a diagram showing an embodiment in which a first actuator and a second actuator are each comprised of a motor-driven actuator.

FIG. 7 is a diagram showing an embodiment in which the first actuator 18A and the second actuator 18B are each comprised of a motor-driven actuator. The construction of this embodiment, not particularly described here, is the same as that of the embodiment described above with reference to FIGS. 2 through 6, and therefore a duplicate description thereof will be omitted. The first actuator 18A includes a first servo motor 19A, and a first ball screw mechanism 20A coupled to the first roller base 16A. The second actuator 18B includes a second servo motor 19B, and a second ball screw mechanism 20B coupled to the second roller base 16B. The servo motors 19A and 19B are connected to the ball screw mechanisms 20A and 20B, respectively. When the servo motors 19A, 19B drive the ball screw mechanisms 20A, 20B, the two sets of rollers 11 move in directions closer to and away from each other.

The servo motors 19A, 19B are electrically connected to an actuator controller 21. By controlling the operations of the servo motors 19A, 19B, the actuator controller 21 can precisely control the positions of the rollers 11 upon polishing of the wafer W. Further, since the two rollers 11 can pivot on the pivot shaft 17C, the positions of the rollers 11 holding the wafer W can be adjusted. Though the four rollers 11, arranged around the axis CP of the substrate holder 10, are provided in this embodiment, the number of rollers 11 is not limited to four. For example, it is possible to use three rollers 11, arranged around the axis CP at equal intervals, i.e. 120-degree intervals, and to provide an actuator for each roller 11. In one embodiment, three rollers 11 are arranged around the axis CP at equal angular intervals of 120 degrees, and two of the three rollers 11 are coupled by the first belt 14A. An actuator is provided for the two rollers 11 coupled by the first belt 14A, and another actuator is provided for the remaining roller 11 which is not coupled by the first belt 14A.

As shown in FIG. 1, a rinsing-liquid supply nozzle 27 for supplying a rinsing liquid (e.g. pure water or an alkaline chemical solution) to the first surface 1 of the wafer W is disposed below the wafer W held by the substrate holder 10. The rinsing-liquid supply nozzle 27 is coupled to a not-shown rinsing-liquid supply source. The rinsing-liquid supply nozzle 27 is directed at the center O1 of the first surface 1 of the wafer W. The rinsing liquid is supplied from the rinsing-liquid supply nozzle 27 to the first surface 1 of the wafer W, and spreads on the first surface 1 of the wafer W due to a centrifugal force. The rinsing liquid flows radially outward on the first surface 1 of the wafer W, and can thereby remove polishing debris from the first surface 1 of the wafer W.

A protective-liquid supply nozzle 28 for supplying a protective liquid (e.g. pure water) to the second surface 2 of the wafer W is disposed above the wafer W held by the substrate holder 10. The protective-liquid supply nozzle 28 is coupled to a not-shown protective-liquid supply source. The protective-liquid supply nozzle 28 is directed at the center of the second surface 2 of the wafer W. The protective liquid is supplied from the protective-liquid supply nozzle 28 to the second surface 2 of the wafer W, and spreads on the second surface 2 of the wafer W due to a centrifugal force. The protective liquid prevents the rinsing liquid, containing polishing debris produced by polishing of the wafer W and other foreign matter, from flowing onto the second surface 2 of the wafer W and adhering to the second surface 2. Therefore, the second surface 2 of the wafer W can be kept clean.

As shown in FIG. 1, the translational rotating mechanism 60 includes a motor 62, a crankshaft 70 secured to the motor 62, a table 69, a base 71, and a plurality of eccentric joints 65. The motor 62 is disposed under the base 71 and secured to the lower surface of the base 71. The crankshaft 70 extends upwardly through the base 71. The table 69 is connected to the base 71 by the eccentric joints 65 and the crankshaft 70. The table 69 is coupled to the eccentric joints 65 via bearings 67, and is coupled to the crankshaft 70 via a bearing 68. The base 71 is coupled to the eccentric joints 65 via bearings 75. While only two eccentric joints 65 are depicted in FIG. 1, the translational rotating mechanism 60 includes at least two eccentric joints 65.

A distal end of the crankshaft 70 is decentered by a distance e from the axis of the motor 62. Accordingly, when the motor 62 is in motion, the table 69 makes a circular motion with a radius e. A circular motion is defined herein as a movement of an object in a circular orbit. Since the table 69 is supported by the eccentric joints 65, the table 69 itself does not rotate when the table 69 is making the circular motion. The eccentricity of the eccentric joints 65 is equal to the eccentricity of the table 69. Such movement of the table 69 is also termed a translational rotating motion. A movement of an object in a circular orbit without rotation of the object itself is defined herein as a translational rotating motion. The polishing head 50 and the polishing-tape supply mechanism 41 are secured to the table 69. Therefore, when the translational rotating mechanism 60 is in motion, the polishing head 50 and the polishing-tape supply mechanism 41 make a translational rotating motion together (in synchronization).

Figure 8:
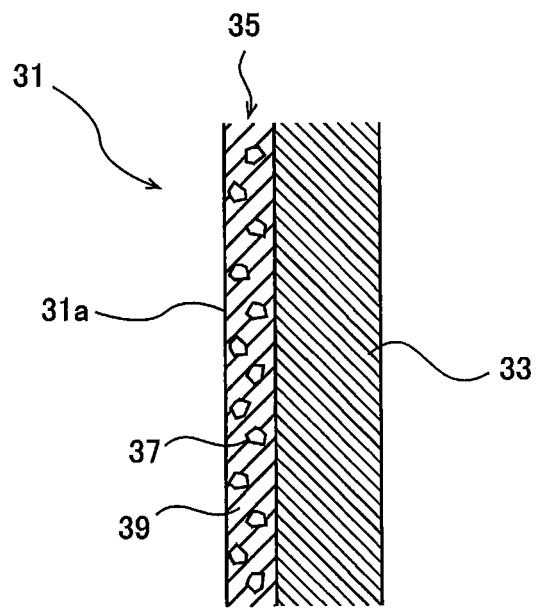
FIG. 8 is a schematic view showing an example of a polishing tape.
Figure 9:
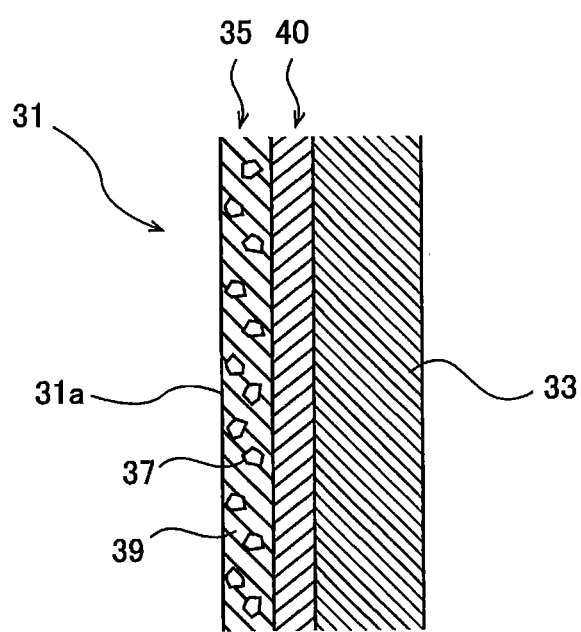
FIG. 9 is a schematic view showing another example of a polishing tape.

A polishing tape 31, having abrasive particles on its surface, is used as a polishing tool in this embodiment. FIG. 8 is a schematic view showing an example of the polishing tape 31. The polishing tape 31 shown in FIG. 8 comprises a base tape 33 and a polishing layer 35. The surface of the base tape 33 is covered with the polishing layer 35. The polishing layer 35 is composed of abrasive particles 37 and a binder (resin) 39 that holds the abrasive particles 37. A polishing surface 31a of the polishing tape 31 is constituted by an exposed surface of the polishing layer 35. FIG. 9 is a schematic view showing another example of the polishing tape 31. The polishing tape 31 shown in FIG. 9 comprises a base tape 33, a polishing layer 35, and an elastic layer 40 located between them. The elastic layer 40 may be composed of a polypropylene, polyurethane, polyester or nylon nonwoven fabric, or an elastic material such as silicone rubber.

Returning to FIG. 1, the polishing head 50 is disposed below the substrate-holding surfaces 11a and disposed face up. The polishing head 50 includes a polishing blade 55 for pressing the polishing tape 31 against the first surface 1 of the wafer W, a pressing mechanism 52 for pushing up the polishing blade 55, and a support member 79 that supports the pressing mechanism 52. The support member 79 is secured to the table 69 of the translational rotating mechanism 60 so that the entirety of the polishing head 50 can make the translational rotating motion together with the table 69. The support member 79 has a not-shown throughhole through which the polishing tape 31 extends.

The polishing-tape supply mechanism 41 includes a tape feeding reel 43 for supplying the polishing tape 31, and a tape take-up reel 44 for taking up the polishing tape 31. The tape feeding reel 43 and the tape take-up reel 44 are coupled to a tension motor 43a and a tension motor 44a, respectively. These tension motors 43a, 44a are secured to a reel base 42, and can exert a predetermined tension on the polishing tape 31 by applying predetermined torques to the tape feeding reel 43 and the tape take-up reel 44. The reel base 42 is secured to the table 69 of the translational rotating mechanism 60 so that the entirety of the polishing-tape supply mechanism 41 can make a translational rotating motion together with the table 69.

A tape advancing device 46 for advancing the polishing tape 31 in its longitudinal direction is provided between the tape feeding reel 43 and the tape take-up reel 44. The tape advancing device 46 includes a tape advancing roller 48 for advancing the polishing tape 31, a nip roller 49 for pressing the polishing tape 31 against the tape advancing roller 48, and a tape advancing motor 47 for rotating the tape advancing roller 48. The polishing tape 31 is sandwiched between the nip roller 49 and the tape advancing roller 48. When the tape advancing motor 47 rotates the tape advancing roller 48 in the direction indicated by arrow in FIG. 1, the polishing tape 31 is advanced from the tape feeding reel 43 to the tape take-up reel 44 via the polishing blade 55. An advancing speed of the polishing tape 31 can be changed by changing the rotational speed of the tape advancing motor 47. In one embodiment, the polishing tape 31 may be advanced in a direction opposite the direction indicated by the arrow in FIG. 1 (the positions of the tape feeding reel 43 and the tape take-up reel 44 may be reversed). Also in this case, the tape advancing device 46 is installed at the side of the tape take-up reel 44.

The polishing tape 31 is supplied to an upper surface of the polishing blade 55 such that the polishing surface 31a of the polishing tape 31 faces the first surface 1 of the wafer W. The polishing surface 31a of the polishing tape 31 is defined herein as the surface to be located over the polishing blade 55 and to be pressed against the first surface 1 of the wafer W.

The polishing apparatus further includes guide rollers 53a, 53b, 53c, 53d that support the polishing tape 31. The polishing tape 31 is guided by these guide rollers 53a, 53b, 53c, 53d such that the polishing tape 31 surrounds the polishing blade 55 and the pressing mechanism 52. The polishing head 50 presses the polishing tape 31 with the polishing blade 55 against the first surface 1 of the wafer W from the back side of the polishing tape 31, thereby polishing the first surface 1 of the wafer W. The guide rollers 53b, 53c, disposed at both sides of the polishing head 50, guide the polishing tape 31 so that the polishing tape 31 advances in a direction parallel to the first surface 1 of the wafer W.

The tape advancing device 46 and the guide rollers 53a, 53b, 53c, 53d are secured to not-shown holding members which are secured to the table 69 of the translational rotating mechanism 60. Accordingly, when the translational rotating mechanism 60 is in motion, the polishing head 50, the polishing-tape supply mechanism 41, the tape advancing device 46, and the guide rollers 53a, 53b, 53c, 53d make a translational rotating motion together (i.e. in synchronization).

Figure 10:
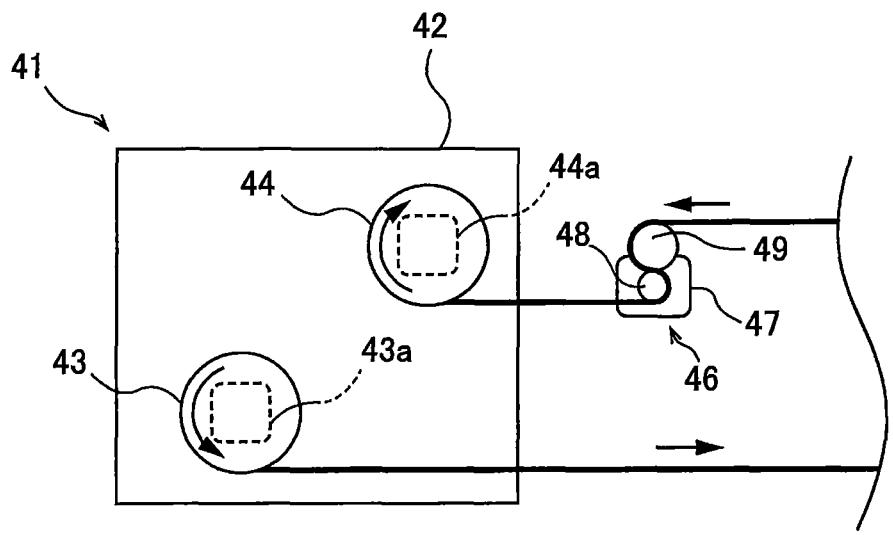
FIG. 10 is a schematic view showing another embodiment of a polishing-tape supplying mechanism.
Figure 11:
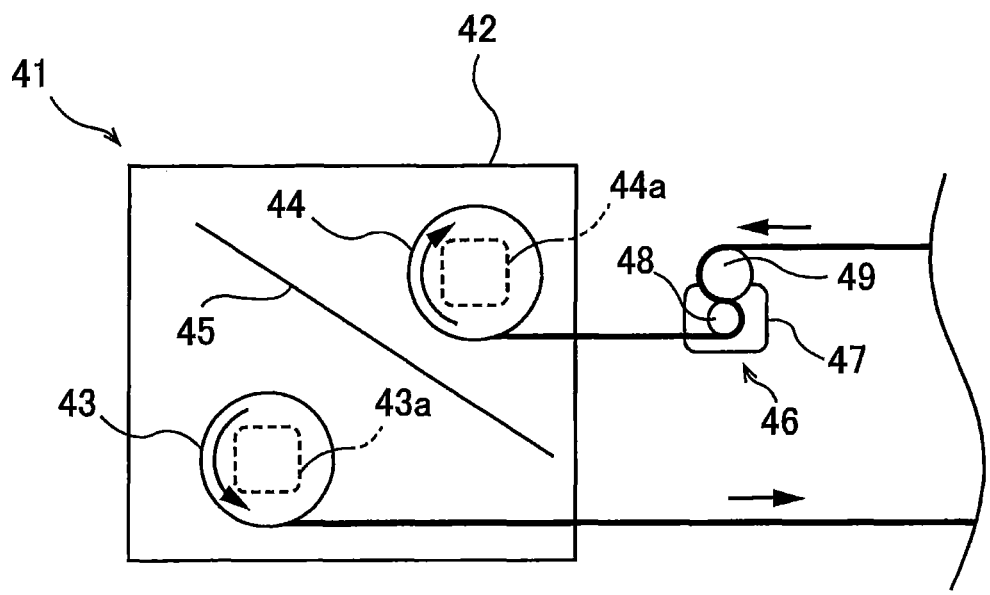
FIG. 11 is a schematic view showing still another embodiment of a polishing-tape supplying mechanism.

In one embodiment, the tape feeding reel 43 may be located more outwardly than the tape take-up reel 44 as shown in FIG. 10. Such an arrangement can prevent the rinsing liquid, containing polishing debris produced by polishing of the wafer W and other foreign matter, from adhering to the tape feeding reel 43 even when the rinsing liquid drops from the tape take-up reel 44. As a result, contamination of the polishing tape 31 before polishing can be prevented. In another embodiment, a partition 45 may be provided between the tape feeding reel 43 and the tape take-up reel 44 as shown in FIG. 11. The partition 45 is secured to the reel base 42. The embodiment shown in FIG. 11 can also prevent the rinsing liquid containing polishing debris and other foreign matter, which has dropped from the tape take-up reel 44, from adhering to the tape feeding reel 43. The partition 45 is preferably inclined so as to quickly remove the rinsing liquid from the tape take-up reel 44.

Figure 12:
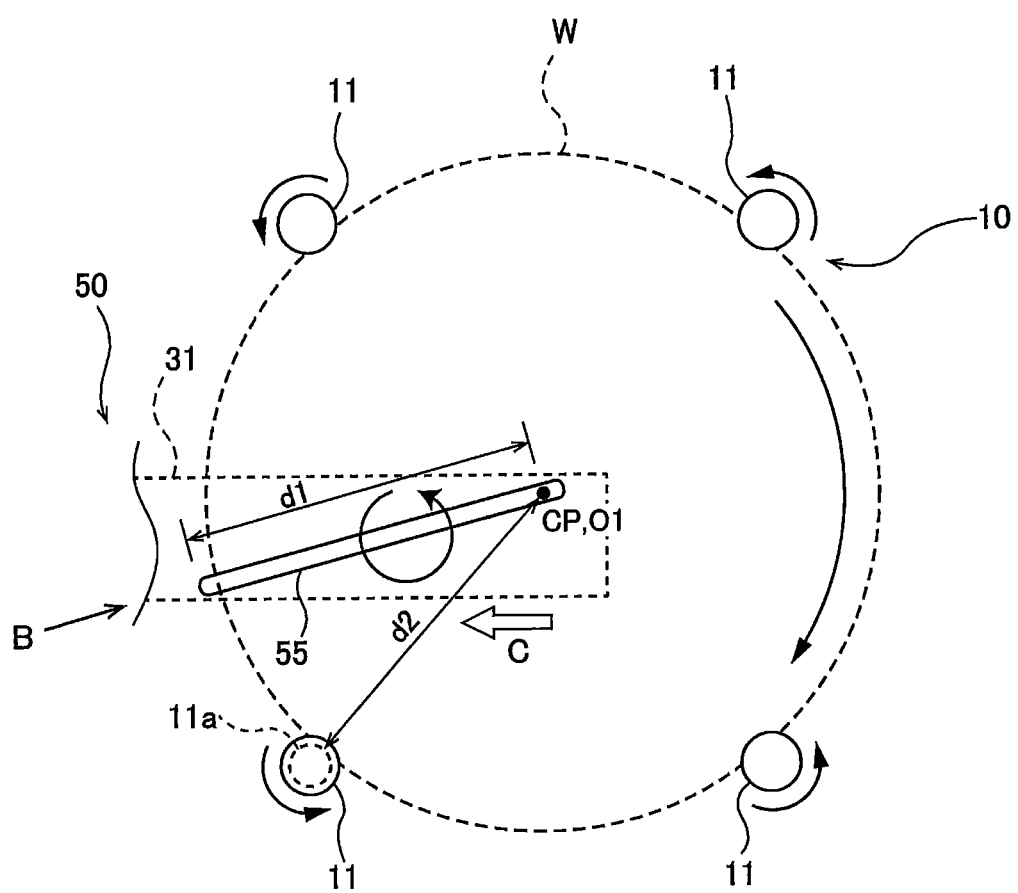
FIG. 12 is a plan view showing an arrangement of a polishing head.
Figure 13:
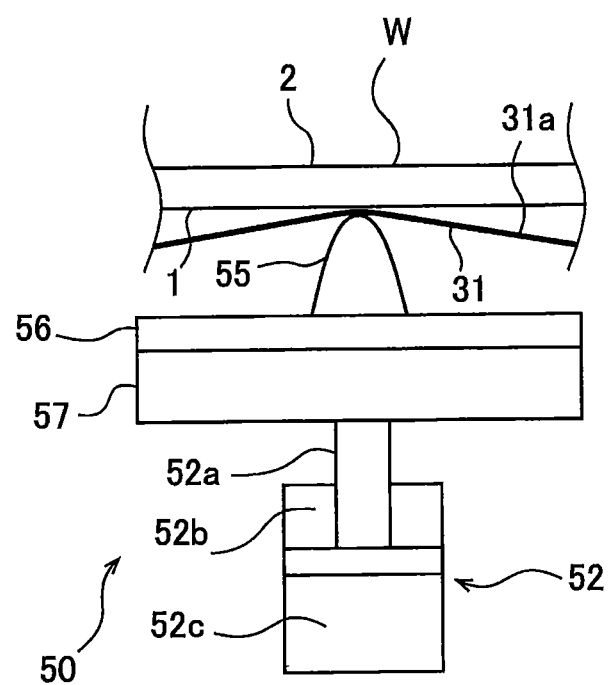
FIG. 13 is a diagram showing the polishing head as viewed from a direction indicated by arrow B in FIG. 12.

FIG. 12 is a plan view showing an arrangement of the polishing head 50, and FIG. 13 is a diagram showing the polishing head 50 as viewed from a direction indicated by arrow B in FIG. 12. As shown in FIG. 12, the polishing head 50 is disposed such that a part of the polishing blade 55 protrudes outside the periphery of the wafer W. Specifically, a distance d1 from the axis CP of the substrate holder 10 to an outermost end of the polishing blade 55 is longer than a distance d2 from the axis CP to the substrate-holding surface 11a of each roller 11 holding the wafer W. In this embodiment, the polishing blade 55 is longer than the radius of the wafer W, and an top edge of the polishing blade 55 has a rounded cross-sectional shape. More specifically, one end of the polishing blade 55 protrudes outside the periphery of the wafer W, while the other end extends across the center O1 of the first surface 1 of the wafer W (i.e. the axis CP of the substrate holder 10). Therefore, the polishing blade 55 can bring the polishing tape 31 into contact with the entirety of the first surface 1, ranging from the center O1 to the outermost area, of the wafer W. The polishing blade 55 may be composed of a resin material such as PEEK (polyether ether ketone). In one embodiment, the polishing blade 55 may be longer than the diameter of the wafer W.

During polishing of the wafer W, the wafer W is rotated by the rollers 11. The positions of all the rollers 11 are fixed, while the rollers 11 are rotating on their own axes. Therefore, even though a part of the polishing blade 55 protrudes outside the periphery of the wafer W, the rollers 11 do not contact the polishing blade 55. During polishing of the wafer W, the polishing head 50 including the polishing blade 55 is caused to make a translational rotating motion by the translational rotating mechanism 60. The translational rotating motion allows the polishing head 50 to move relative to the wafer W, thereby ensuring a significant relative speed between the polishing tape 31 and the wafer W at any contact point (hereinafter referred to as polishing point) between the polishing tape 31 and the first surface 1 of the wafer W. In particular, the translational rotating mechanism 60 can ensure a sufficiently high relative speed between the wafer W and the polishing tape 31 at the center of the wafer W. The polishing head 50 is located in such a position as not to contact the rollers 11 when the polishing head 50 makes the translational rotating motion. The polishing tape 31 can therefore polish the entirety of the first surface 1, including the outermost area, of the wafer W.

As shown in FIG. 12, the polishing blade 55 extends obliquely with respect to the advancing direction of the polishing tape 31 (indicated by arrow C). In this embodiment the advancing direction C of the polishing tape 31 coincides with the longitudinal direction of the polishing tape 31. Further, the polishing blade 55 extends over the entirety of the width of the polishing tape 31 without protruding outside the polishing tape 31. Since the polishing blade 55 is inclined obliquely with respect to the advancing direction C of the polishing tape 31 (i.e., with respect to the longitudinal direction of the polishing tape 31), an unused portion of the polishing tape 31 can be brought into contact with the wafer W even on the downstream side in the advancing direction of the polishing tape 31 (on the peripheral side of the wafer W in this embodiment). This configuration can prevent a decrease in a polishing rate due to the use of the polishing tape 31 which has been deteriorated by polishing.

As shown in FIG. 13, the polishing blade 55 is provided on a surface of a holding pad 56 and projects upward. The holding pad 56 is secured to a surface of a back plate 57. The pressing mechanism 52 is disposed under the back plate 57, and is coupled to a lower surface of the back plate 57. The pressing mechanism 52 is configured to be capable of elevating and lowering the polishing blade 55, the holding pad 56, and the back plate 57 together. During polishing of the wafer W, the pressing mechanism 52 pushes up the polishing blade 55, the holding pad 56, and the back plate 57, so that the top edge of the polishing blade 55 can press the polishing tape 31 against the first surface 1 of the wafer W to thereby polish the first surface 1. The rounded cross-sectional shape of the top edge of the polishing blade 55 can reduce a contact resistance between the polishing tape 31 and the polishing blade 55. During a polishing standby period (non-polishing period), the pressing mechanism 52 keeps the polishing blade 55, the holding pad 56 and the back plate 57 in lowered positions to keep the polishing tape 31 away from the first surface 1 of the wafer W.

In one embodiment, the pressing mechanism 52 is comprised of an air cylinder. The pressing mechanism 52, comprised of an air cylinder, includes a piston rod 52a coupled to the back plate 57, a first pressure chamber 52b for pushing down the piston rod 52a when a gas is supplied into the first pressure chamber 52b, and a second pressure chamber 52c for pushing up the piston rod 52a when a gas is supplied into the second pressure chamber 52c. Pressures of the gases supplied to the first pressure chamber 52b and the second pressure chamber 52c are controlled by a not-shown pressure regulator. An electropneumatic regulator is an example of the pressure regulator. The use of the pressure regulator can apply a constant pressing force to the polishing tape 31.

In one embodiment, instead of the polishing tape 31, a fixed abrasive, such as a grindstone, may be used as a polishing tool. The fixed abrasive may be secured either to the surface of the back plate 57 or to the surface of the polishing blade 55. The polishing head 50 can polish the first surface 1 of the wafer W by bringing the fixed abrasive into contact with the first surface 1.

In one embodiment, the fixed abrasive may be secured in a ring to the surface of the back plate 57. In this case, the polishing head 50 is provided with a not-shown rotating mechanism. The rotating mechanism is secured to the back plate 57 so that the fixed abrasive and the back plate 57 can be rotated by the rotating mechanism. The polishing head 50 can polish the first surface 1 of the wafer W by bringing the fixed abrasive into contact with the first surface 1 while rotating the fixed abrasive.

The operation of the polishing apparatus of the embodiment will now be described. The following operation of the polishing apparatus is controlled by an operation controller 180 shown in FIG. 1. The operation controller 180 is electrically connected to the substrate holder 10, the polishing head 50, the polishing-tape supply mechanism 41, the tape advancing device 46, and the translational rotating mechanism 60. The operations of the substrate holder 10, the rinsing-liquid supply nozzle 27, the protective-liquid supply nozzle 28, the polishing head 50, the polishing-tape supply mechanism 41, the tape advancing device 46, and the translational rotating mechanism 60 are controlled by the operation controller 180. The operation controller 180 is comprised of a dedicated computer or a general-purpose computer.

The wafer W to be polished is held by the rollers 11 of the substrate holder 10, with the first surface 1 facing downward, and is rotated about the axis of the wafer W. In particular, the substrate holder 10 rotates the wafer W by rotating the rollers 11 about their respective axes while keeping the rollers 11 in contact with the periphery of the wafer W with its first surface 1 facing downward. Next, the rinsing liquid is supplied from the rinsing-liquid supply nozzle 27 onto the first surface 1 of the wafer W, and the protective liquid is supplied from the protective-liquid supply nozzle 28 onto the second surface 2 of the wafer W. The rinsing liquid flows radially outward on the first surface 1 of the wafer W, while the protective liquid spreads over the entirety of the second surface 2 of the wafer W due to the centrifugal force.

The operation controller 180 activates the polishing-tape supply mechanism 41 and the tape advancing device 46 to advance the polishing tape 31 in the longitudinal direction at a predetermined speed while applying a predetermined tension to the polishing tape 31. While the translational rotating mechanism 60 causes the polishing head 50, the polishing-tape supply mechanism 41, the guide rollers 53a, 53b, 53c, 53d, and the tape advancing device 46 to make a translational rotating motion, the polishing head 50 places the polishing tape 31 in contact with the first surface 1 of the wafer W to thereby polish the first surface 1 in the presence of the rinsing liquid. More specifically, the pressing mechanism 52 pushes the polishing blade 55 upwardly to cause the polishing blade 55 to press the polishing surface 31a of the polishing tape 31 against the first surface 1 of the wafer W, thereby polishing the entirety of the first surface 1 of the wafer W. The polishing apparatus supplies the rinsing liquid and the protective liquid to the wafer W at all times during polishing of the wafer W.

As described above, one end of the polishing blade 55 protrudes outside the periphery of the wafer W, while the other end extends across the center O1 of the first surface 1 of the wafer W. Therefore, the polishing blade 55 can place the polishing tape 31 in contact with the entirety of the first surface 1, ranging from the center O1 to the outermost area, of the wafer W. The positions of the rollers 11 remain stationary during polishing of the wafer W; therefore, the rollers 11 do not contact the polishing blade 55. Moreover, since the polishing head 50, including the polishing blade 55, makes the translational rotating motion, a sufficiently high relative speed between the polishing tape 31 and the wafer W can be achieved even at the center of the wafer W. As a result, the polishing tape 31 can polish the entirety of the polishing surface 1, including the outermost area, of the wafer W at a high polishing rate.

After a preset time has elapsed, the pressing mechanism 52 lowers the polishing blade 55 to separate the polishing tape 31 from the first surface 1 of the wafer W. The operation controller 180 then stops the operations of the substrate holder 10, the rinsing-liquid supply nozzle 27, the protective-liquid supply nozzle 28, the polishing head 50, the polishing-tape supply mechanism 41, the tape advancing device 46, and the translational rotating mechanism 60, thus terminating polishing of the wafer W.

Figure 14:
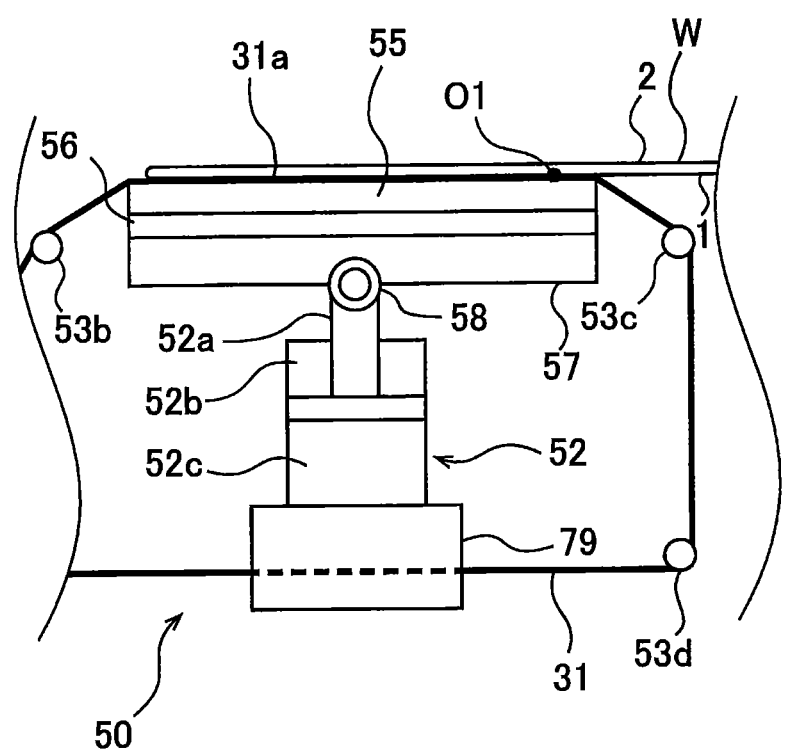
FIG. 14 is a schematic view showing another embodiment of a polishing head.

FIG. 14 is a schematic view showing another embodiment of a polishing head 50. The construction and operation of this embodiment, not particularly described here, are the same as those of the embodiment described above with reference to FIGS. 1 through 13, and therefore a duplicate description thereof will be omitted. In this embodiment, the polishing head 50 includes a spherical bearing 58 which tiltably supports the polishing blade 55, the holding pad 56, and the back plate 57. The piston rod 52a of the pressing mechanism 52 is coupled to the back plate 57 via the spherical bearing 58.

According to the embodiment shown in FIG. 14, the polishing blade 55, supported by the spherical bearing 58, is tiltable in multiple directions. Therefore, even when there is warping and/or deflection of the wafer W, a posture (i.e. an angle) of the polishing blade 55 can change according to the shape of the first surface 1 of the wafer W. Accordingly, the polishing blade 55 can press the polishing tape 31 against the wafer W with a uniform pressing force.

Figure 15:
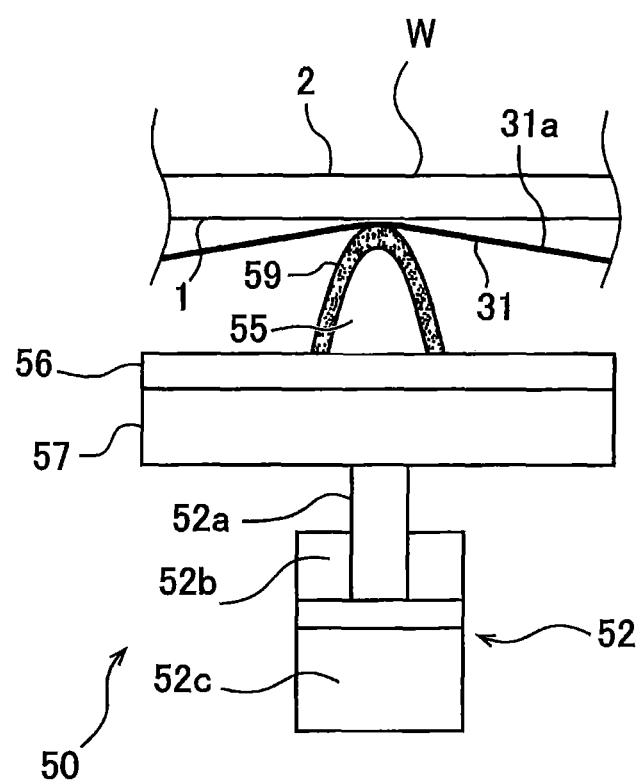
FIG. 15 is a schematic view showing still another embodiment of a polishing head.

FIG. 15 is a schematic view showing yet another embodiment of a polishing head 50. The construction and operation of this embodiment, not particularly described here, are the same as those of the embodiment described above with reference to FIGS. 1 through 13, and therefore a duplicate description thereof will be omitted. In this embodiment, the polishing head 50 has a soft material 59 that covers the polishing blade 55. The soft material 59 is provided such that it covers at least the top edge of the polishing blade 55. The polishing blade 55, covered with the soft material 59, can press the polishing tape 31 against the wafer W with a more uniform pressing force. A silicone sponge is an example of the soft material 59. The soft material 59 according to this embodiment may be used in combination with the spherical bearing 58 shown in FIG. 14.

Figure 16:
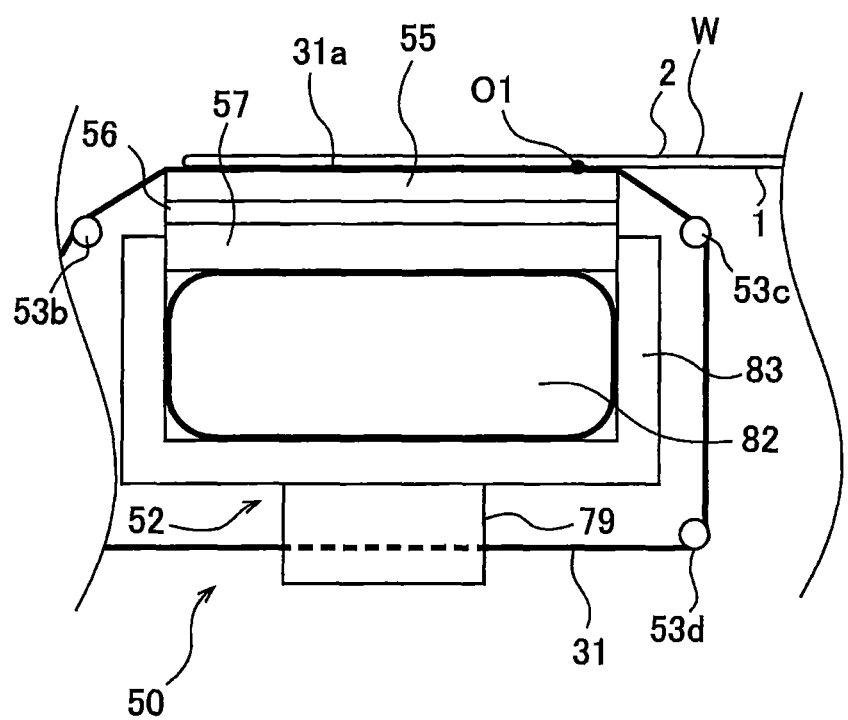
FIG. 16 is a schematic view showing still another embodiment of a polishing head.

FIG. 16 is a schematic view showing yet another embodiment of a polishing head 50. The construction and operation of this embodiment, not particularly described here, are the same as those of the embodiment described above with reference to FIGS. 1 through 13, and therefore a duplicate description thereof will be omitted. The polishing head 50 of this embodiment includes, as the pressing mechanism 52, a combination of an air bag 82 and an air bag guide 83. The air bag 82 is disposed under the back plate 57, and the air bag guide 83 is disposed so as to surround side and lower surfaces of the air bag 82. The air bag guide 83 is secured to a frame (not shown) of the polishing head 50.

As shown in FIG. 16, the air bag 82 is inflated when a gas is supplied into the air bag 82. Downward expansion and lateral expansion of the air bag 82 are restricted by the air bag guide 83. Therefore, the air bag 82 expands upward, thereby pushing the polishing blade 55, the holding pad 56, and the back plate 57 upwardly. When the gas is removed from the air bag 82, the polishing blade 55, the holding pad 56, and the back plate 57 are lowered, until the polishing tape 31 leaves the first surface 1 of the wafer W. Also in this embodiment, the angle of the polishing blade 55 can change according to the shape of the wafer W. Accordingly, the polishing blade 55 can press the polishing tape 31 against the wafer W with a uniform pressing force. Pressure of the gas supplied into the air bag 82 is controlled by a not-shown pressure regulator. An electropneumatic regulator is an example of the pressure regulator. The use of the pressure regulator can apply a constant pressing force to the polishing tape 31.

Figure 17:
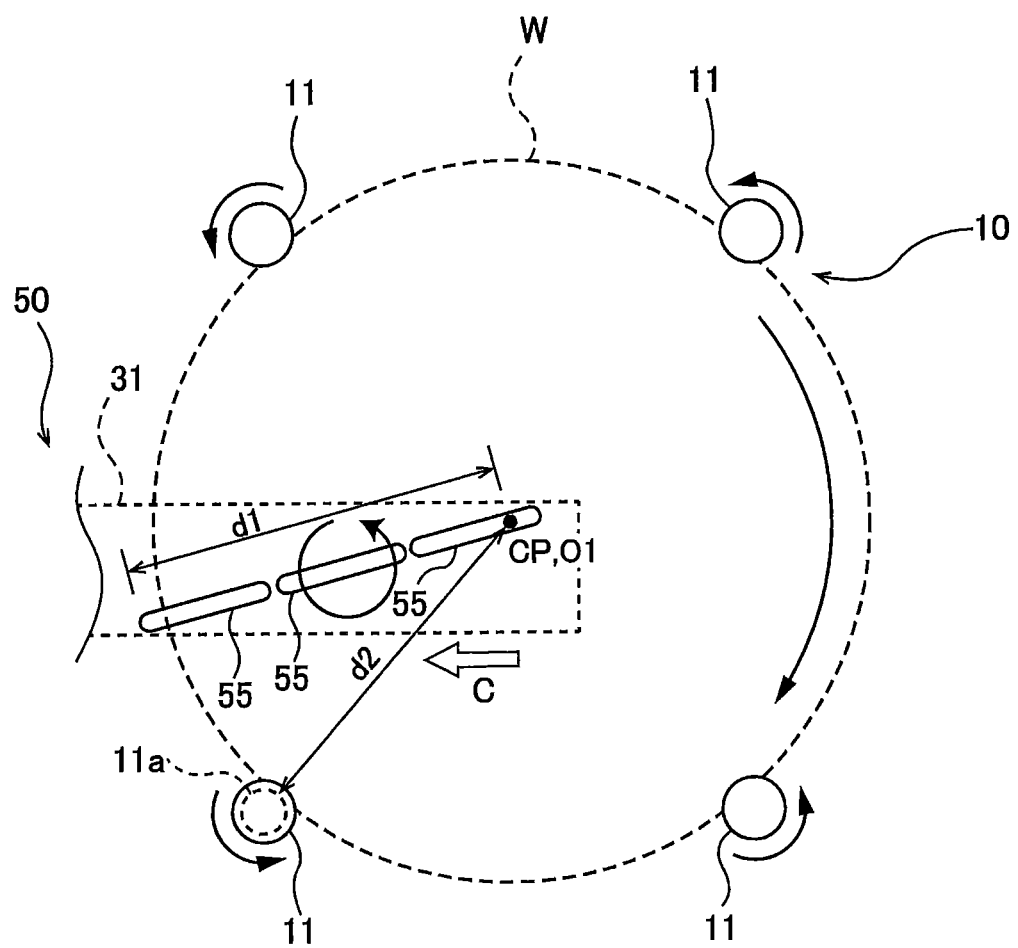
FIG. 17 is a plan view showing still another embodiment of a polishing head.
Figure 18:
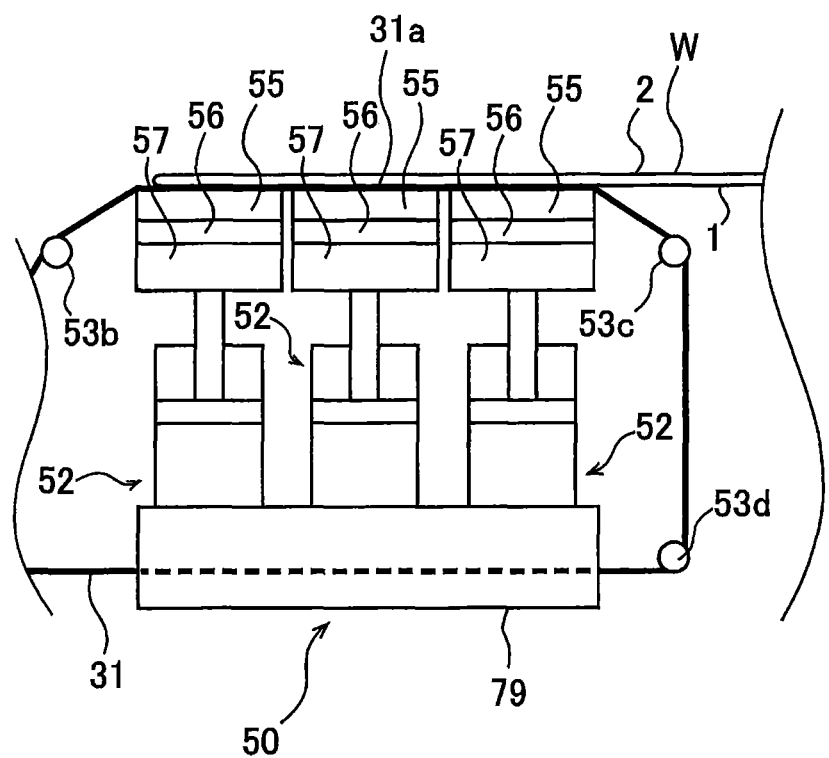
FIG. 18 is a schematic diagram showing the polishing head shown in FIG. 17 as viewed from a lateral direction.

FIG. 17 is a plan view schematically showing yet another embodiment of a polishing head 50, and FIG. 18 is a schematic view of the polishing head 50 of FIG. 17 as viewed from a lateral direction. The construction and operation of this embodiment, not particularly described here, are the same as those of the embodiment described above with reference to FIGS. 1 through 13, and therefore a duplicate description thereof will be omitted. The polishing head 50 of this embodiment includes a plurality of polishing blades 55, a plurality of holding pads 56, a plurality of back plates 57, and a plurality of pressing mechanisms 52. The polishing blades 55 are arranged in a line, and the entirety of the polishing blades 55 extends obliquely with respect to the advancing direction of the polishing tape 31. The polishing blades 55 are located at different distances from the axis CP of the substrate holder 10. Also in this embodiment, a distance d1 from the axis CP of the substrate holder 10 to the outermost end of the entirety of the polishing blades 55 is longer than a distance d2 from the axis CP to the substrate-holding surface 11a of each roller 11 holding the wafer W. The entirety of the polishing blades 55 is longer than the radius of the wafer W. One end of the entirety of the polishing blades 55, arranged side-by-side in a line, protrudes outside the periphery of the wafer W, while the other end extends across the center O1 of the first surface 1 of the wafer W (i.e. the axis CP of the substrate holder 10). In one embodiment, the entirety of the polishing blades 55 may be longer than the diameter of the wafer W. In this embodiment, the pressing mechanisms 52 are each comprised of an air cylinder.

A difference in the relative speed between the polishing tape 31 and the wafer W exists between a central area and a peripheral area of the wafer W. This difference in the relative speed may result in a difference in the polishing rate between the central area and the peripheral area of the first surface 1 of the wafer W. According to this embodiment, the pressing mechanisms 52 are configured to be capable of operating independently of each other. Thus, the pressing forces applied from the polishing blades 55 to the polishing tape 31 can be adjusted by means of the respective pressing mechanisms 52. For example, a polishing blade 55 disposed at the central area of the wafer W applies a first pressing force to the polishing tape 31, and a polishing blade 55 disposed at the peripheral area of the wafer W applies a second pressing force, which is smaller than the first pressing force, to the polishing tape 31. Such operations can reduce the difference in the polishing rate between the central area and the peripheral area of the first surface 1 of the wafer W. As a result, the polishing head 50 of this embodiment can make the polishing rate uniform over the entirety of the first surface 1 of the wafer W. The polishing head 50 of this embodiment may include the spherical bearing 58, described above with reference to FIG. 14, and/or the soft material 59 described above with reference to FIG. 15.

Figure 19:
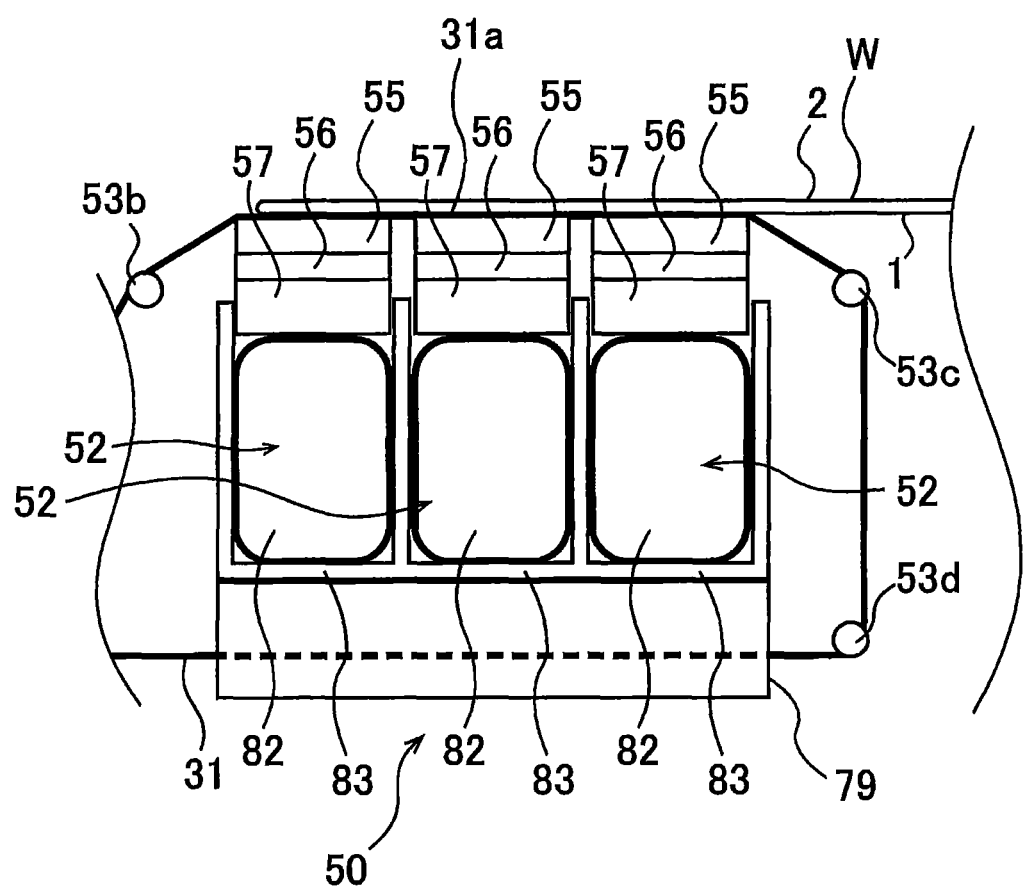
FIG. 19 is a schematic diagram showing a combination of a plurality of air bags and a plurality of air-bag guides.

In one embodiment, as shown in FIG. 19, the pressing mechanisms 52 may include, instead of the air cylinders, a plurality of air bags 82 capable of operating independently of each other, and a plurality of air bag guides 83 in which the air bags 82 are housed, respectively.

Figure 20:
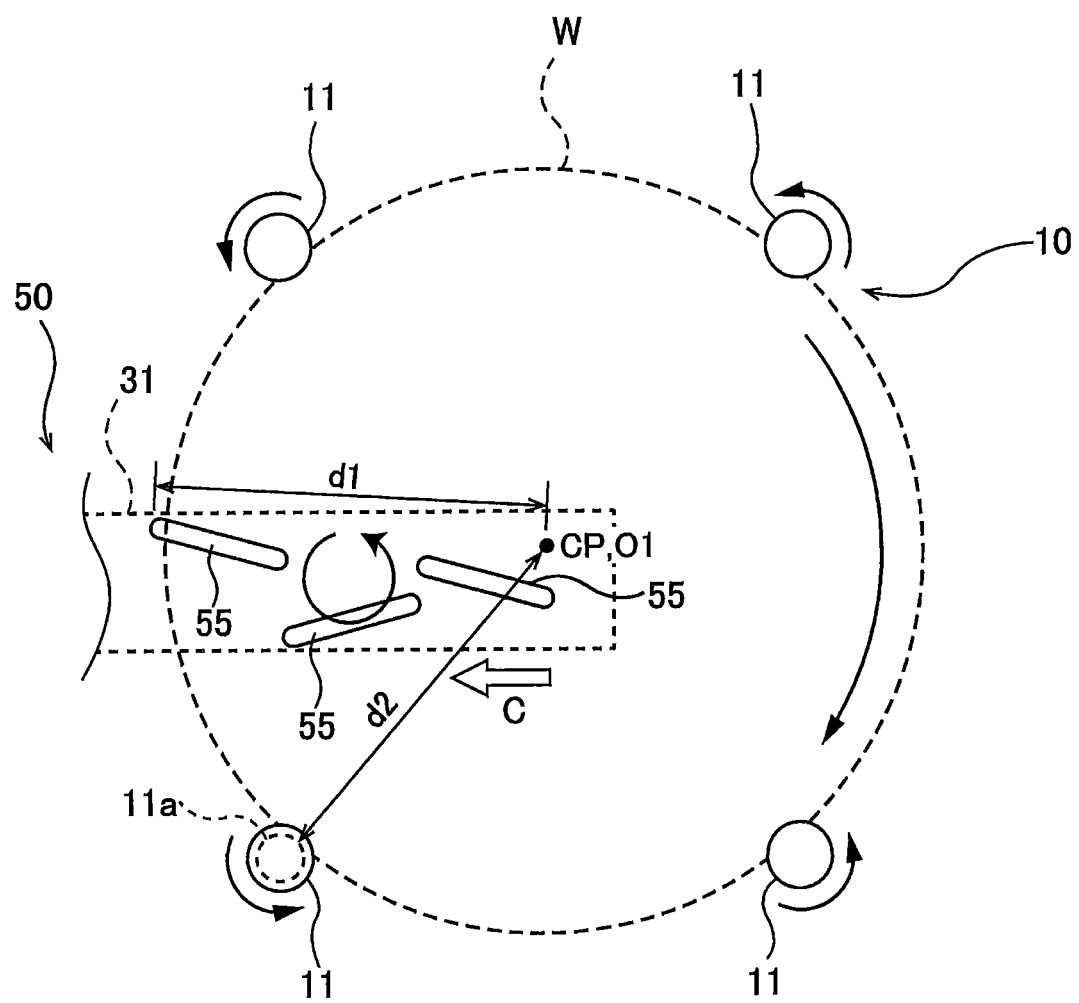
FIG. 20 is a schematic view showing still another embodiment of a polishing head.

FIG. 20 is a plan view schematically showing yet another embodiment of a polishing head 50. The construction and operation of this embodiment, not particularly described here, are the same as those of the embodiment described above with reference to FIGS. 17 and 18, and therefore a duplicate description thereof will be omitted. As shown in FIG. 20, the construction of this embodiment is the same as that of the embodiment shown in FIG. 17 in that a plurality of polishing blades 55 are disposed at different distances from the axis CP of the substrate holder 10, but differs in that the polishing blades 55 shown in FIG. 20 are not arranged in a line. Also in this embodiment, a distance d1 from the axis CP of the substrate holder 10 to the outermost end of the entirety of the polishing blades 55 is longer than a distance d2 from the axis CP to the substrate-holding surface 11a of each roller 11 holding the wafer W.

The polishing blades 55 are arranged continuously along the advancing direction C of the polishing tape 31 (i.e. the longitudinal direction of the polishing tape 31), and arranged continuously along a direction perpendicular to the advancing direction C of the polishing tape 31. Each of the polishing blades 55 of this embodiment extends obliquely with respect to the advancing direction C of the polishing tape 31. The polishing blades 55, when viewed from the advancing direction C of the polishing tape 31, extend continuously with no space therebetween.

Although the polishing blades 55 are not arranged in a line, these polishing blades 55 are located at different distances from the axis CP of the substrate holder 10. Therefore, when the wafer W is rotating, any area of the first surface 1 of the wafer W passes over one of the polishing blades 55. Thus, the polishing blades 55 can press the polishing tape 31 against the entire area of the first surface 1 of the wafer W. An additional polishing blade(s) may be disposed at the same distance from the axis CP as the distance of one of the polishing blades 55 from the axis CP. In this case, a certain area of the first surface 1 of the wafer W passes over the two blades, namely the additional polishing blade and the polishing blade 55 located at the same radial position. As a result, the polishing rate in that area increases. In one embodiment, the pressing mechanisms 52 may include, instead of the air cylinders, the plurality of air bags 82 capable of operating independently of each other and the plurality of air bag guides 83 in which the respective air bags 82 are housed, described above with reference to FIG. 19.

Figure 21:
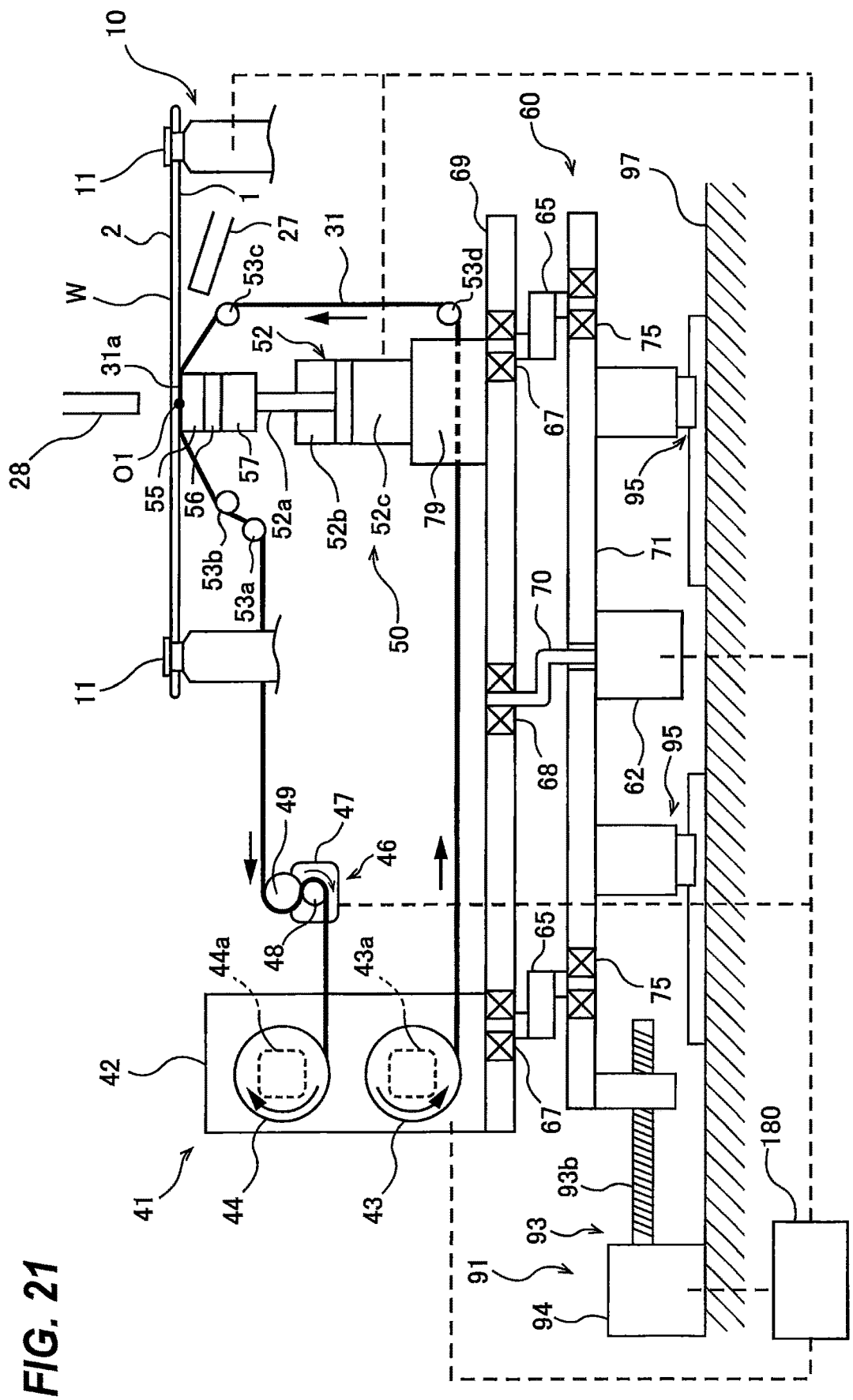
FIG. 21 is a schematic view showing another embodiment of a polishing apparatus.
Figure 22:
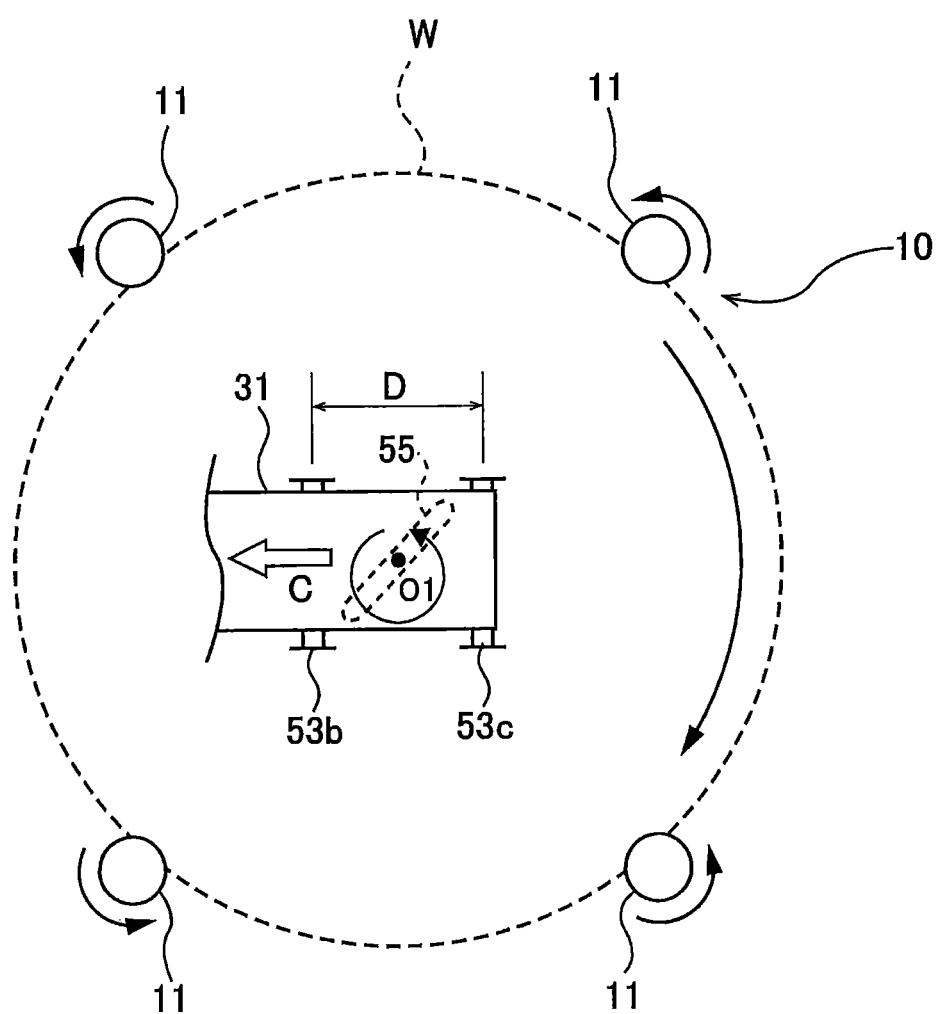
FIG. 22 is a schematic view of the polishing head and the substrate holder of FIG. 21 as viewed from above.

FIG. 21 is a schematic view showing another embodiment of a polishing apparatus, and FIG. 22 is a schematic view of the polishing head 50 and the substrate holder 10 of FIG. 21 as viewed from above. The construction and operation of this embodiment, not particularly described here, are the same as those of the embodiment described above with reference to FIGS. 1 through 13, and therefore a duplicate description thereof will be omitted. The polishing blade 55 of this embodiment is shorter than the radius of the wafer W. Therefore, a distance D from the guide roller 53b to the guide roller 53c can be reduced. This arrangement enables the guide rollers 53b, 53c to exert a strong constraining force on the polishing tape 31 at a polishing point. The polishing head 50 of this embodiment may include the spherical bearing 58, described above with reference to FIG. 14, and/or the soft material 59 described above with reference to FIG. 15. In one embodiment, the polishing blade 55 may be disposed perpendicularly to the advancing direction C of the polishing tape 31. Such an arrangement of the polishing blade 55 can further reduce the distance D from the guide roller 53b to the guide roller 53c. As a result, the guide rollers 53b, 53c can exert a stronger constraining force on the polishing tape 31 at a polishing point.

In order to bring the polishing tape 31 into contact with the entirety of the first surface 1, ranging from the center O1 to the outermost area, of the wafer W, the polishing apparatus of this embodiment includes a polishing-head moving mechanism 91 for translating the polishing head 50 relative to the substrate holder 10. The polishing-head moving mechanism 91 is configured to move the polishing head 50 between the center O1 and the outermost area of the first surface 1 of the wafer W.

A plurality of linear motion guides 95 are secured to the lower surface of the base 71, so that the base 71 is supported by the linear motion guides 95. These linear motion guides 95 are disposed on an installation surface 97. The base 71 is moved by the polishing-head moving mechanism 91, and the linear motion guides 95 restrict the movement of the base 71 to a linear movement in a radial direction of the wafer W.

The polishing-head moving mechanism 91 includes a ball screw mechanism 93, and a motor 94 for driving the ball screw mechanism 93. A servo motor can be used as the motor 94. The base 71 is coupled to a screw shaft 93b of the ball screw mechanism 93. When the polishing-head moving mechanism 91 is set in motion, the polishing head 50, the polishing-tape supply mechanism 41, the tape advancing device 46, the guide rollers 53a, 53b, 53c, 53d, and the translational rotating mechanism 60 move together in the radial direction of the wafer W.

During polishing of the wafer W, the polishing-head moving mechanism 91 moves the polishing blade 55 of the polishing head 50 between the center O1 and the outermost area of the first surface 1 of the wafer W, while the translational rotating mechanism 60 causes the polishing head 50 to make a translational rotating motion. The polishing-head moving mechanism 91 is electrically connected to the operation controller 180, and the operation of the polishing-head moving mechanism 91 is controlled by the operation controller 180. In one embodiment, the polishing head 50 may include, as the pressing mechanism 52, the combination of air bag 82 and air bag guide 83, described above with reference to FIG. 16.

Details of the operation of the polishing apparatus of this embodiment are as follows. The polishing-head moving mechanism 91 moves the polishing head 50 to a position below the center O1 of the first surface 1 of the wafer W. Next, while the translational rotating mechanism 60 causes the polishing head 50 to make a translational rotating motion, the polishing head 50 brings the polishing tape 31 into contact with the first surface 1 of the wafer W to start polishing of the first surface 1 in the presence of the rinsing liquid. While the polishing head 50 is polishing the first surface 1 of the wafer W with the polishing tape 31, the polishing-head moving mechanism 91 moves the translational rotating mechanism 60 and the polishing head 50 outward in the radial direction of the wafer W. In one embodiment, the operation controller 180 may instruct the polishing-head moving mechanism 91 to move the translational rotating mechanism 60 and the polishing head 50, while changing the movement speed of the translational rotating mechanism 60 and the polishing head 50, the rotational speed of the translational rotating motion, the pressing force of the polishing blade 55 applied by the pressing mechanism 52, and/or the advancing speed of the polishing tape 31.

The operation controller 180 terminates polishing of the wafer W when the polishing blade 55 reaches the outermost area of the first surface 1 of the wafer W. In one embodiment, the polishing-head moving mechanism 91 may reciprocate the polishing blade 55 between the outermost area and the center O1 of the first surface 1 of the wafer W. Such an operation makes it possible for the polishing tape 31 to polish the entirety of the polishing surface 1, including the outermost area, of the wafer W.

Figure 23:
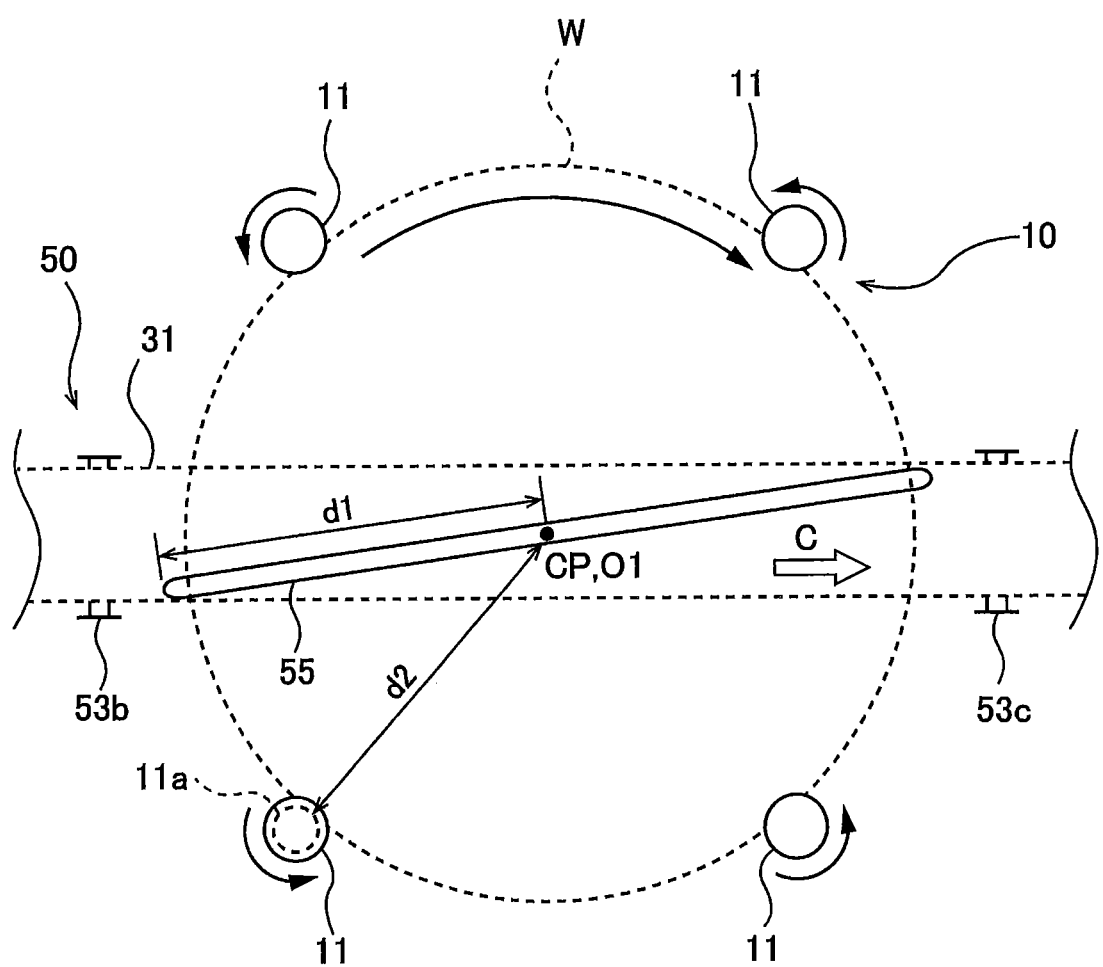
FIG. 23 is a plan view schematically showing another embodiment of a polishing apparatus.
Figure 24:
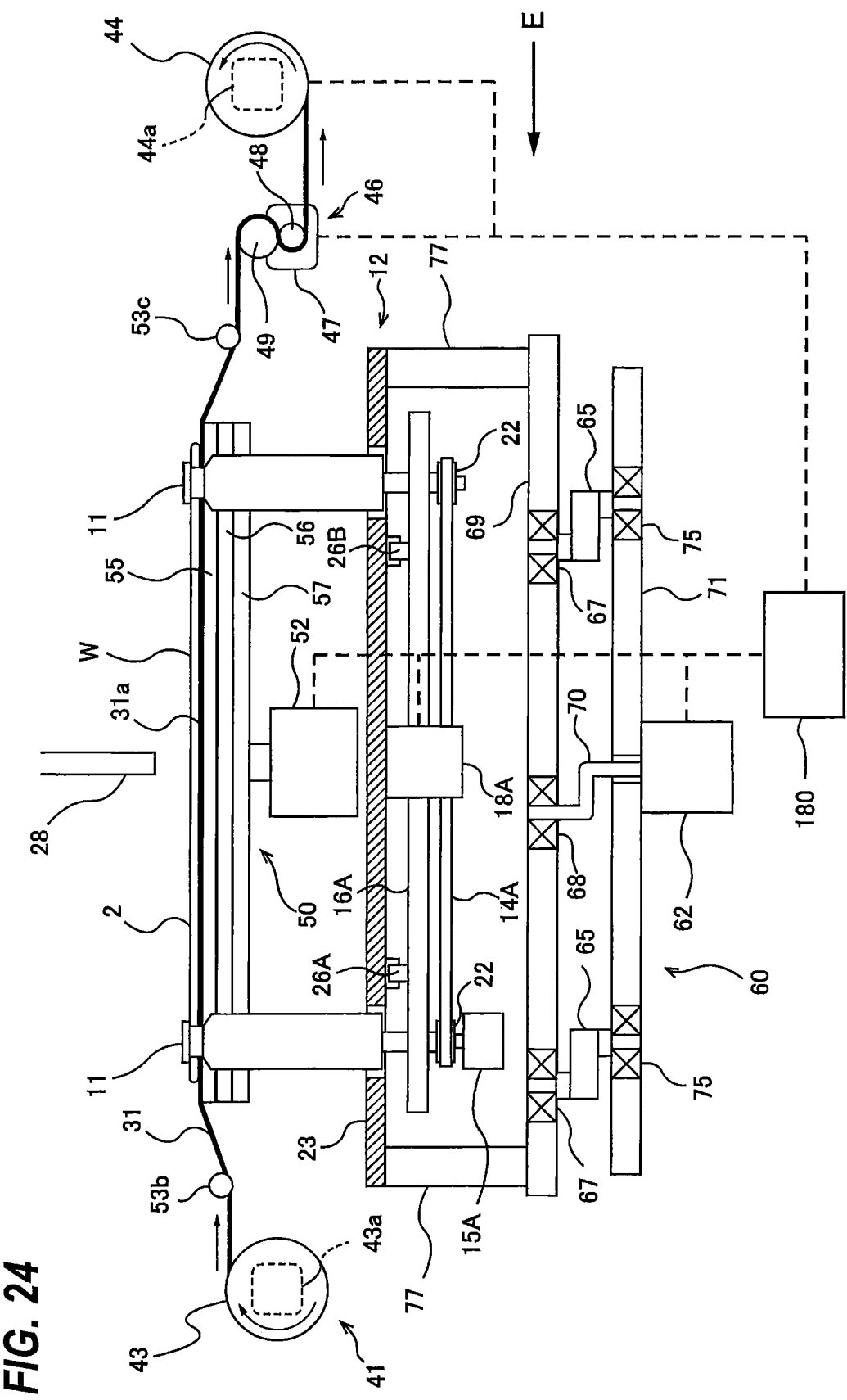
FIG. 24 is a schematic view of the polishing apparatus of FIG. 23 as viewed from a lateral direction.
Figure 25:
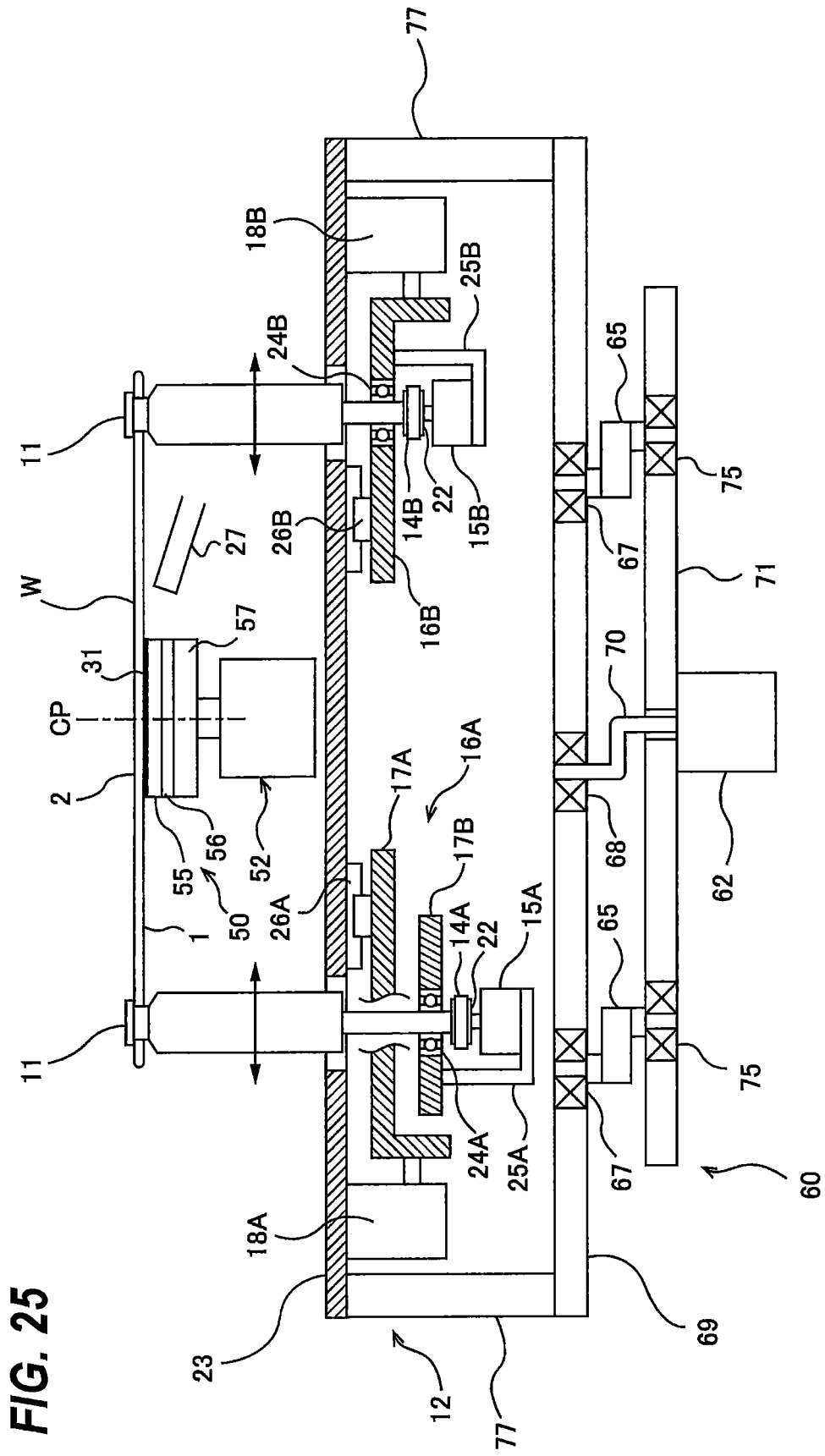
FIG. 25 is a schematic view of the polishing apparatus as viewed in a direction of arrow E shown in FIG. 24.

FIG. 23 is a schematic view showing another embodiment of a polishing apparatus, FIG. 24 is a schematic view of the polishing apparatus of FIG. 23 as viewed from a lateral direction, and FIG. 25 is a schematic view of the polishing apparatus of FIG. 23 as viewed from a direction indicated by arrow E shown in FIG. 24. The construction and operation of this embodiment, not particularly described here, are the same as those of the embodiment described above with reference to FIGS. 1 through 13, and therefore a duplicate description thereof will be omitted. In this embodiment, the position of the polishing head 50 is fixed. The polishing apparatus of this embodiment is not provided with the support member 79 used in the previously-described embodiment. The polishing head 50 is secured to a not-shown fixing member.

The tape feeding reel 43 and the tape take-up reel 44 of the polishing-tape supply mechanism 41 are disposed at both sides of the substrate holder 10. The tape advancing device 46 is disposed between the substrate holder 10 and the tape take-up reel 44. In this embodiment, the advancing of the polishing tape 31 is guided by the guide rollers 53b, 53c.

The polishing apparatus of this embodiment includes a translational rotating mechanism 60 for causing the substrate holder 10 to make a translational rotating motion. The translational rotating mechanism 60 is disposed below the substrate holder 10. A table 69 of the translational rotating mechanism 60 is secured to the lower surface of the base plate 23 via a plurality of connecting members 77. Accordingly, the substrate holder 10 makes a translational rotating motion together with the table 69. During polishing of the wafer W, the polishing apparatus of this embodiment causes the entireties of the wafer W and the substrate holder 10 to make a translational rotating motion while keeping the position of the polishing head 50 fixed.

As shown in FIG. 23, a distance d1 from the axis CP of the substrate holder 10 to the outermost end of the polishing blade 55 is longer than a distance d2 from the axis CP to the substrate-holding surface 11a of each roller 11 holding the wafer W. In this embodiment, the polishing blade 55 is longer than the diameter of the wafer W, and both ends of the polishing blade 55 protrude outside the periphery of the wafer W. The polishing blade 55 having such a construction can bring the polishing tape 31 into contact with the entirety of the first surface 1 of the rotating wafer W. Therefore, the polishing tape 31 can polish the entirety of the first surface 1, including its outermost area, of the wafer W. The polishing head 50 is disposed in such a position as not to contact the rollers 11 when the entirety of the substrate holder 10 makes the translational rotating motion.

The polishing head 50 of this embodiment may include the spherical bearing 58, described above with reference to FIG. 14, and/or the soft material 59 described above with reference to FIG. 15. In one embodiment, the polishing head 50 may include, as the pressing mechanism 52, the combination of air bag 82 and air bag guide 83, described above with reference to FIG. 16.

Details of the operation of the polishing apparatus of this embodiment are as follows. While the substrate holder 10 is rotating the wafer W, the operation controller 180 activates the polishing-tape supply mechanism 41 and the tape advancing device 46 to advance the polishing tape 31 in the longitudinal direction at a predetermined speed while applying a predetermined tension to the polishing tape 31. While the translational rotating mechanism 60 causes the wafer W and the substrate holder 10 to make a translational rotating motion, the polishing head 50 places the polishing tape 31 in contact with the first surface 1 of the wafer W to thereby polish the first surface 1 in the presence of the rinsing liquid. In particular, the pressing mechanism 52 pushes the polishing blade 55 upwardly to cause the polishing blade 55 to press the polishing surface 31a of the polishing tape 31 against the first surface 1 of the wafer W, thereby polishing the entirety of the first surface 1 of the wafer W. The polishing apparatus supplies the rinsing liquid and the protective liquid to the wafer W at all times during polishing of the wafer W.

In one embodiment, during polishing of the wafer W, the rotational speed of the translational rotating motion of the wafer W may be made higher than the speed of rotation of the wafer W about its own axis. By making the rotational speed of the translational rotating motion of the wafer W higher than the speed of rotation of the wafer W about its axis, a difference in the polishing rate between the central area and the peripheral area of the first surface 1 of the wafer W can be reduced.

Figure 26:
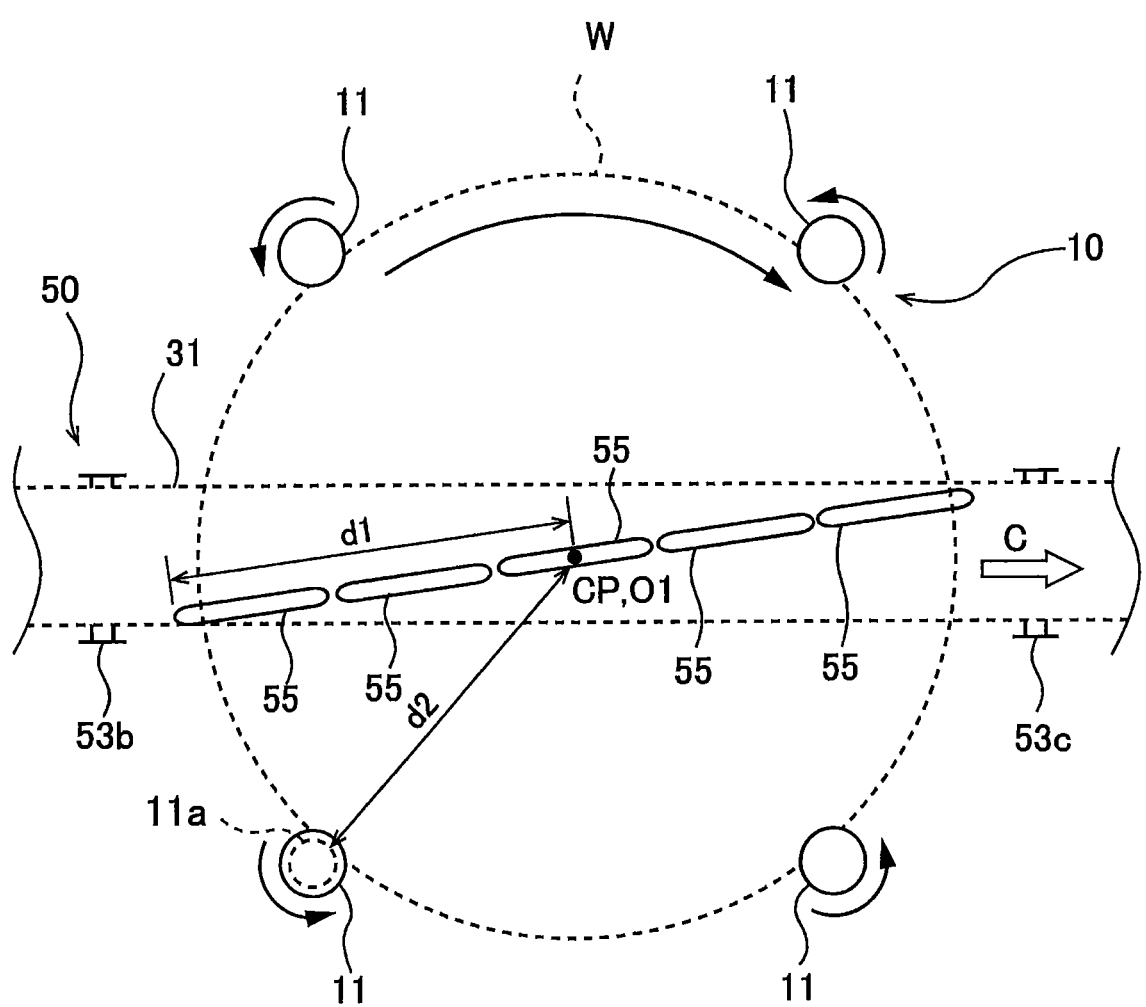
FIG. 26 is a plan view schematically showing another embodiment of a polishing apparatus.
Figure 27:
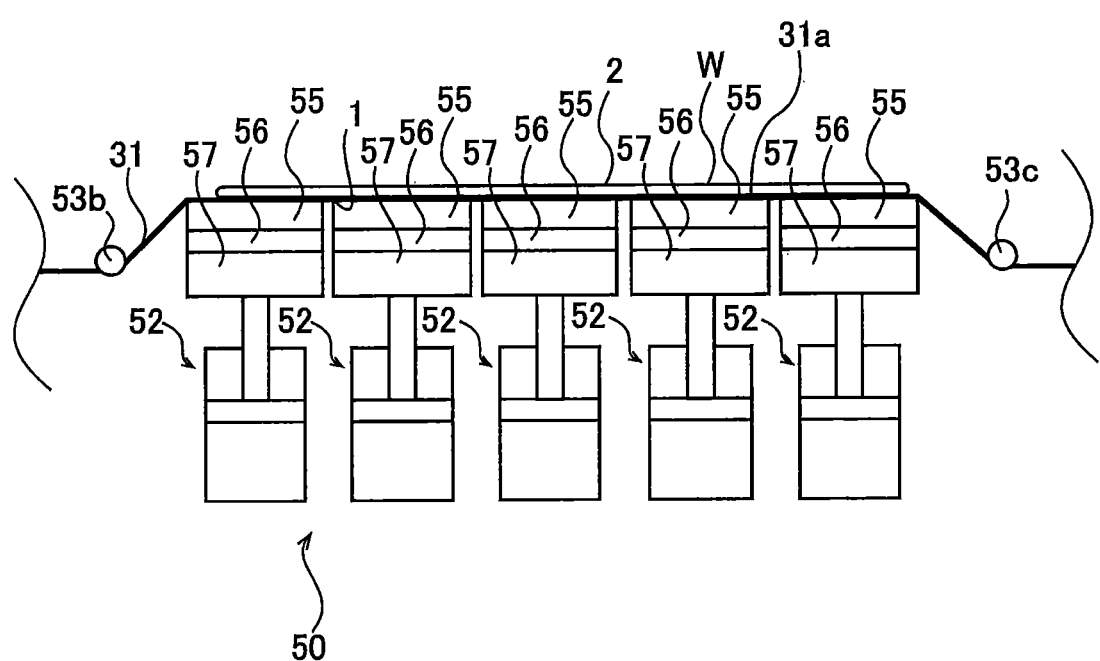
FIG. 27 is a schematic view of a polishing head shown in FIG. 26 as viewed from a lateral direction.

FIG. 26 is a plan view schematically showing another embodiment of a polishing apparatus, and FIG. 27 is a schematic view of the polishing head 50 of FIG. 26 as viewed from a lateral direction. The construction and operation of this embodiment, not particularly described here, are the same as those of the embodiment described above with reference to FIGS. 23 through 25, and therefore a duplicate description thereof will be omitted. The polishing head 50 of this embodiment includes a plurality of polishing blades 55, a plurality of holding pads 56, a plurality of back plates 57, and a plurality of pressing mechanisms 52. The polishing blades 55 are arranged in a line, and the entirety of the polishing blades 55 extend obliquely with respect to the advancing direction of the polishing tape 31. The polishing blades 55 are located at different distances from the axis CP of the substrate holder 10. A distance d1 from the axis CP of the substrate holder 10 to the outermost end of the entirety of the polishing blades 55 is longer than a distance d2 from the axis CP to the substrate-holding surface 11a of each roller 11 holding the wafer W. The entirety of the polishing blades 55 is longer than the diameter of the wafer W. Both ends of the polishing blades 55, arranged side-by-side in a line, protrude outside the periphery of the wafer W. The pressing mechanisms 52 are configured to be capable of operating independently of each other. The polishing head 50 of this embodiment may include the spherical bearing 58, described above with reference to FIG. 14, and/or the soft material 59 described above with reference to FIG. 15. In one embodiment, the pressing mechanisms 52 may include, instead of the air cylinders, the plurality of air bags 82 capable of operating independently of each other and the plurality of air bag guides 83 in which the respective air bags 82 are housed, described above with reference to FIG. 19.

Figure 28:
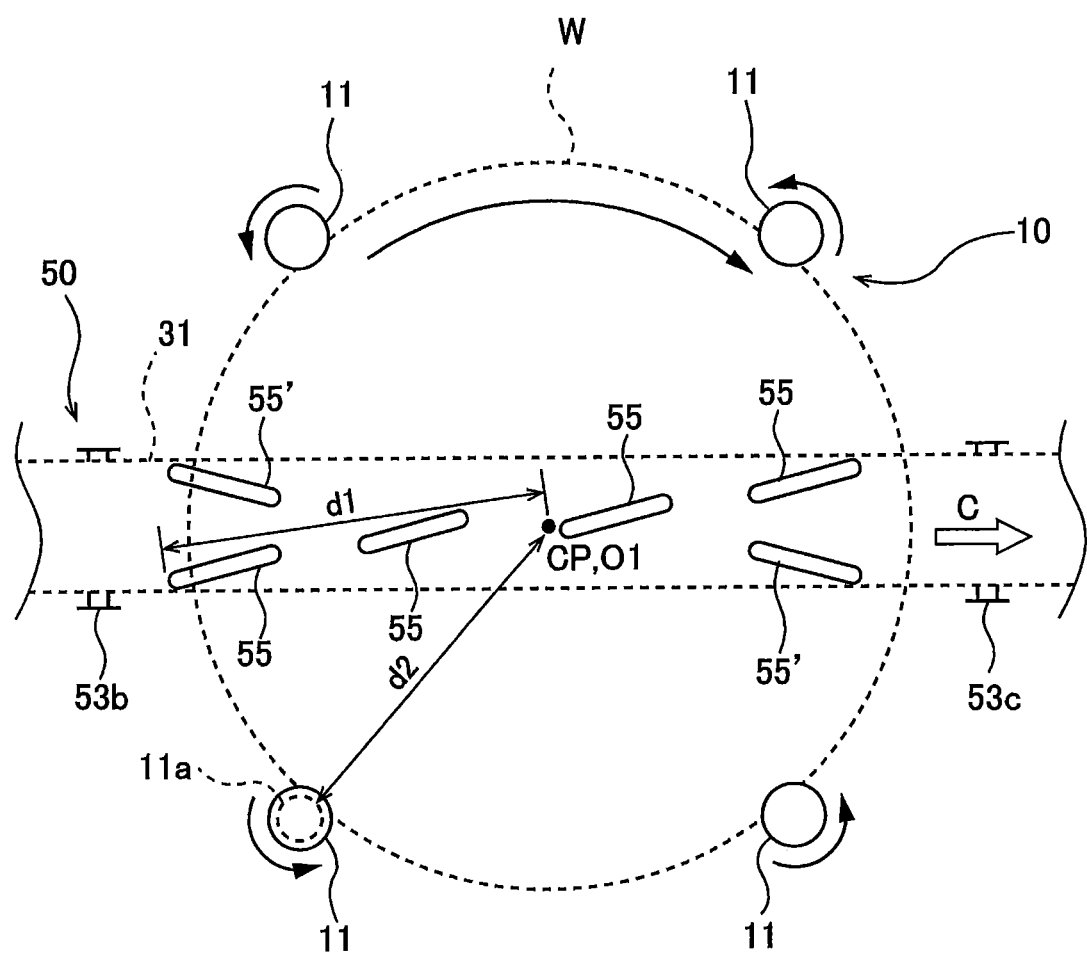
FIG. 28 is a schematic view showing another embodiment of a polishing head.

FIG. 28 is a plan view schematically showing yet another embodiment of a polishing head 50. The construction and operation of this embodiment, not particularly described here, are the same as those of the embodiment described above with reference to FIGS. 26 and 27, and therefore a duplicate description thereof will be omitted. As shown in FIG. 28, a plurality of polishing blades 55 are disposed at different distances from the axis CP of the substrate holder 10. Also in this embodiment, a distance d1 from the axis CP of the substrate holder 10 to the outermost end of the entirety of the polishing blades 55 is longer than a distance d2 from the axis CP to the substrate-holding surface 11a of each roller 11 holding the wafer W.

The polishing blades 55 are arranged intermittently along the advancing direction C of the polishing tape 31 (i.e. the longitudinal direction of the polishing tape 31), and arranged continuously along a direction perpendicular to the advancing direction C of the polishing tape 31. Each of the polishing blades 55 of this embodiment extends obliquely with respect to the advancing direction C of the polishing tape 31. The polishing blades 55, when viewed from the advancing direction C of the polishing tape 31, extend continuously with no space therebetween.

Although the polishing blades 55 are not arranged in a line, these polishing blades 55 are located at different distances from the axis CP of the substrate holder 10. Therefore, when the wafer W is rotating, any area of the first surface 1 of the wafer W passes over one of the polishing blades 55. Thus, the polishing blades 55 can press the polishing tape 31 against the entire area of the first surface 1 of the wafer W.

An additional polishing blade(s) 55' may be disposed at the same distance from the axis CP as the distance of one of the polishing blades 55 from the axis CP. A certain area of the first surface 1 of the wafer W passes over the two blades, namely the additional polishing blade 55' and the polishing blade 55 located at the same radial position. As a result, the polishing rate in that area increases. In the embodiment shown in FIG. 28, two additional polishing blades 55' are disposed at the same radial positions as those of the outer two polishing blades 55. Therefore, the peripheral area of the first surface 1 of the wafer W is polished at a higher polishing rate than that in the central area.

Figure 29:
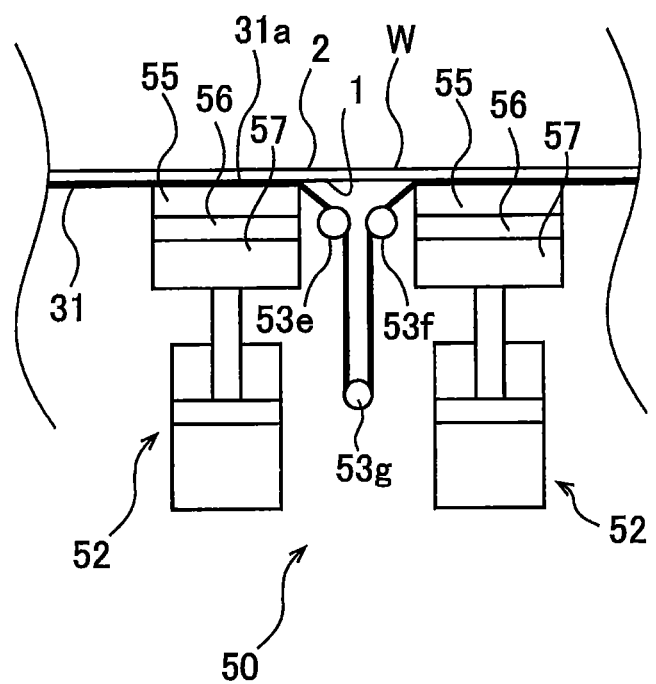
FIG. 29 is an enlarged view of a portion of another embodiment of the polishing head shown in FIGS. 26 through 28.

FIG. 29 is an enlarged view of a portion of another embodiment of the polishing head 50 described above with reference to FIGS. 26 through 28. As shown in FIG. 29, the polishing head 50 of this embodiment includes guide rollers 53e, 53f, 53g disposed between any adjacent two of the pressing mechanisms 52. The guide roller 53g is disposed between and below the guide rollers 53e, 53f.

Figure 30:
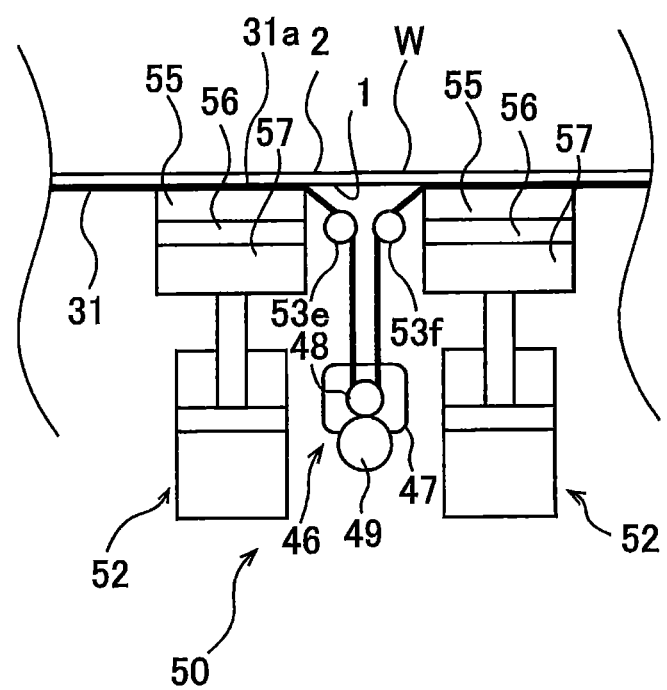
FIG. 30 is an enlarged view showing a part of another embodiment of FIG. 29.

The guide rollers 53e, 53f, 53g support the polishing tape 31 extending between the two adjacent polishing blades 55, and can thereby prevent positional deviation, detachment, folding, etc. of the polishing tape 31. In one embodiment, as shown in FIG. 30, a tape advancing device 46 may be disposed instead of the guide roller 53g. In this case, the tape advancing device 46 shown in FIG. 24 is unnecessary. The embodiment shown in FIG. 30 can also prevent positional deviation, detachment, folding, etc. of the polishing tape 31.

Figure 31:
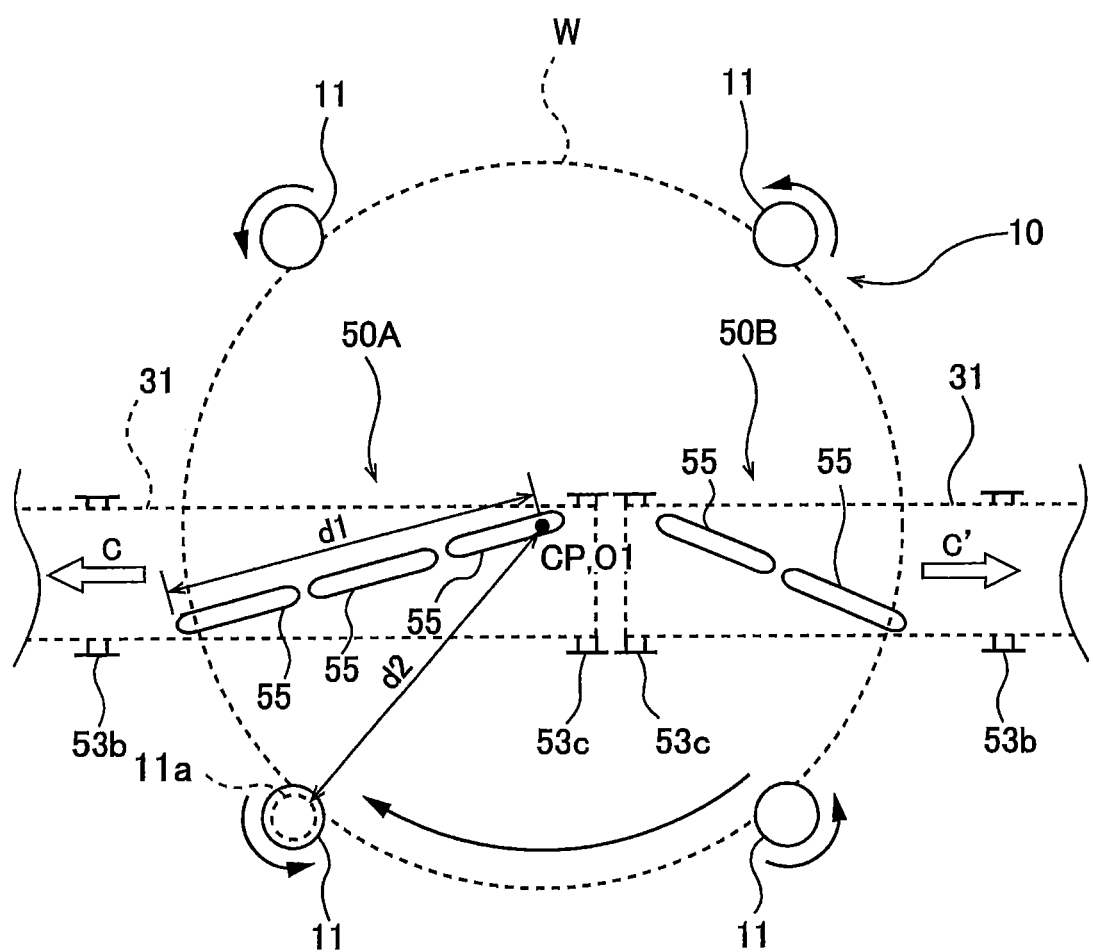
FIG. 31 is a plan view schematically showing another embodiment of the polishing apparatus shown in FIGS. 23 through 30.
Figure 32:
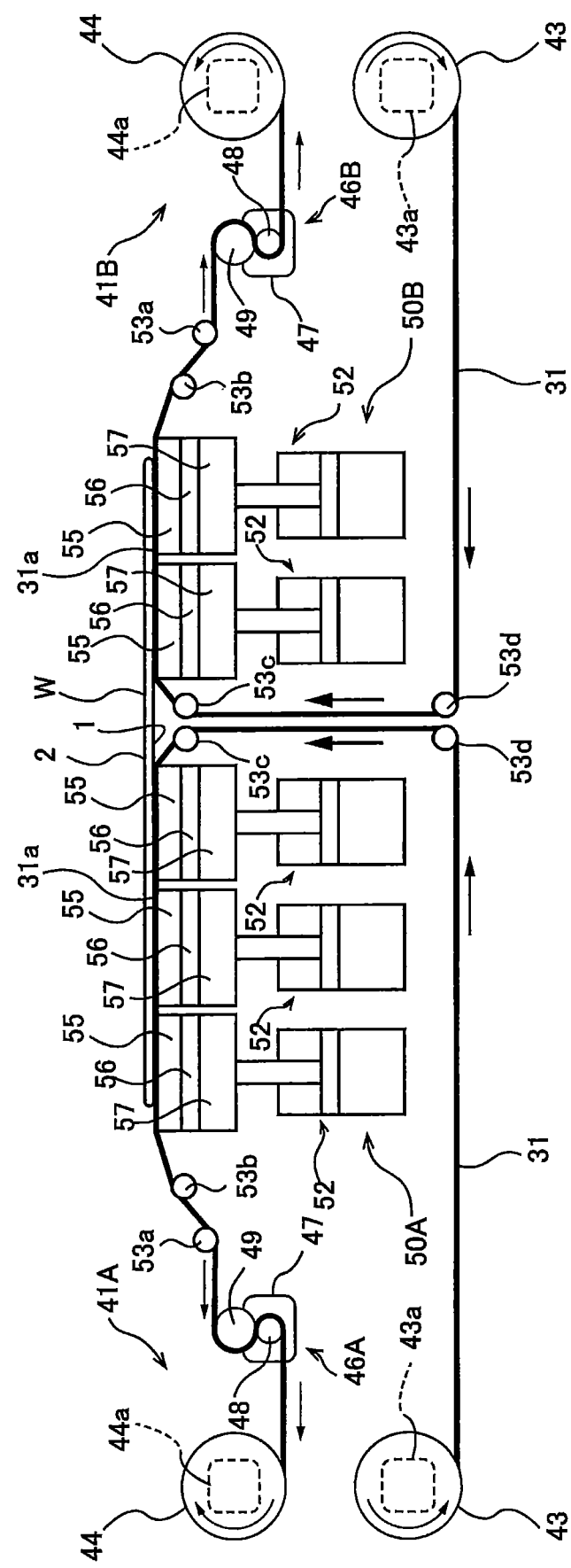
FIG. 32 is a diagram showing a polishing head of FIG. 31 as viewed from a lateral direction.

FIG. 31 is a plan view schematically showing another embodiment of the polishing apparatus described above with reference to FIGS. 23 through 30, and FIG. 32 is a diagram showing the polishing head 50 of FIG. 31 as viewed from a lateral direction. The construction and operation of this embodiment, not particularly described here, are the same as those of the embodiment described above with reference to FIGS. 23 through 30, and therefore a duplicate description thereof will be omitted. In this embodiment, the polishing apparatus includes a first polishing head 50A and a second polishing head 50B for polishing the first surface 1 of the wafer W. Further, the polishing apparatus includes a first polishing-tape supply mechanism 41A and a second polishing-tape supply mechanism 41B for supplying polishing tapes 31 to the first polishing head 50A and the second polishing head 50B, respectively, and a first tape advancing device 46A and a second tape advancing device 46B for advancing the polishing tapes 31 in the longitudinal direction thereof.

The construction of the first polishing head 50A and the construction of the second polishing head 50B are basically the same as the construction of the polishing head 50 according to the embodiment described above with reference to FIGS. 26 and 27. The construction of the first polishing-tape supply mechanism 41A and the construction of the second polishing-tape supply mechanism 41B are basically the same as the construction of the polishing-tape supply mechanism 41 according to the embodiment described above with reference to FIG. 1. The construction of the first tape advancing device 46A and the construction of the second tape advancing device 46B are basically the same as the construction of the tape advancing device 46 according to the embodiment described above with reference to FIG. 1. In the following description, the same reference symbols as used for the above-described embodiments are used to refer to the same or equivalent components or elements, and a duplicate description thereof will be omitted.

The first tape advancing device 46A is disposed between the first polishing head 50A and the first polishing-tape supply mechanism 41A. The second tape advancing device 46B is disposed between the second polishing head 50B and the second polishing-tape supply mechanism 41B. The polishing heads 50A, 50B are arranged side-by-side in a line, and are configured to be capable of operating independently of each other. The respective polishing tapes 31 are advanced in directions indicated by arrows C, C' in FIG. 31, i.e. in directions from the central area toward the peripheral area of the wafer W, with the polishing surfaces 31a kept in contact with the first surface 1 of the wafer W. This embodiment can efficiently move polishing debris, produced by polishing of the wafer W, from the central area toward the peripheral area of the wafer W. In one embodiment, the respective polishing tapes 31 may be advanced in directions opposite the directions indicated by arrows C, C' in FIG. 31 (the positions of each tape feeding reel 43 and each tape take-up reel 44 may be reversed). The polishing heads 50A, 50B each include at least one polishing blade 55, at least one holding pad 56, at least one back plate 57 and at least one pressing mechanism 52. The polishing blades 55 of the polishing head 50A are located at different distances from the axis CP of the substrate holder 10. Similarly, the polishing blades 55 of the polishing head 50B are located at different distances from the axis CP of the substrate holder 10. A distance d1 from the axis CP of the substrate holder 10 to the outermost end of the entirety of the polishing blades 55 is longer than a distance d2 from the axis CP to the substrate-holding surface 11a of each roller 11 holding the wafer W. The entirety of the polishing blades 55 of the polishing head 50A is shorter than the diameter of the wafer W. Similarly, the entirety of the polishing blades 55 of the polishing head 50B is shorter than the diameter of the wafer W. Therefore, compared to the embodiment described above with reference to FIGS. 23 through 25, this embodiment can also prevent positional deviation, detachment, folding, etc. of the polishing tape 31. In this embodiment, the polishing tapes 31 are used as polishing tools. In one embodiment, a plurality of fixed abrasives may be used as polishing tools. In this case, each fixed abrasive may be secured either to the surface of the back plate 57 or to the surface of the polishing blade 55.

Figure 33:
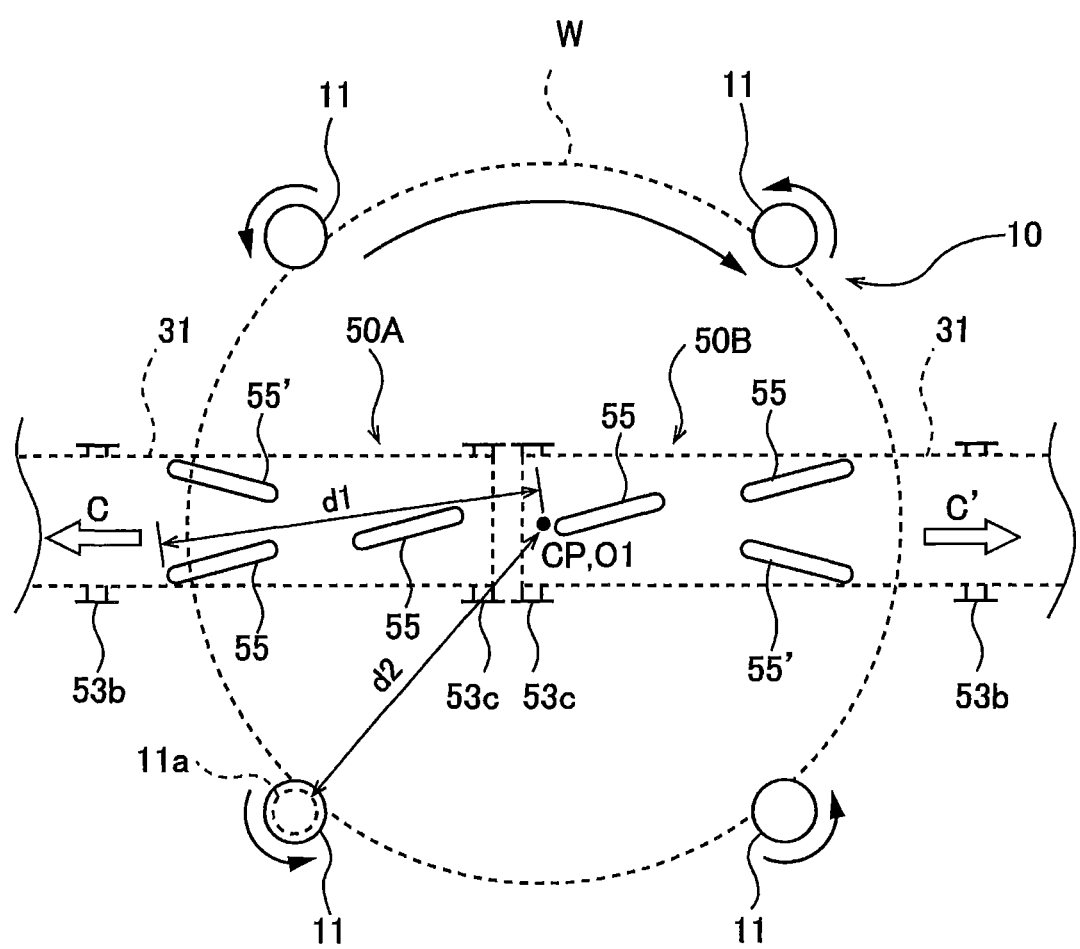
FIG. 33 is a schematic view showing still another embodiment of polishing heads.

FIG. 33 is a plan view schematically showing yet another embodiment of polishing heads 50A, 50B. The construction and operation of this embodiment, not particularly described here, are the same as those of the embodiment described above with reference to FIGS. 31 and 32, and therefore a duplicate description thereof will be omitted. As shown in FIG. 33, the polishing blades 55 of the polishing heads 50A, 50B are arranged at different distances from the axis CP of the substrate holder 10. Also in this embodiment, a distance d1 from the axis CP of the substrate holder 10 to the outermost end of the entirety of the polishing blades 55 is longer than a distance d2 from the axis CP to the substrate-holding surface 11a of each roller 11 holding the wafer W.

The polishing blades 55 are arranged intermittently along the advancing directions C, C' of the polishing tapes 31 (i.e. the longitudinal directions of the polishing tapes 31), and arranged continuously along a direction perpendicular to the advancing directions C, C' of the polishing tapes 31. Each of the polishing blades 55 of this embodiment extends obliquely with respect to the advancing directions C, C' of the polishing tapes 31. The polishing blades 55, when viewed from the advancing directions C, C' of the polishing tapes 31, extend continuously with no space therebetween.

Although the polishing blades 55 are not arranged in a line, these polishing blades 55 are located at different distances from the axis CP of the substrate holder 10. Therefore, when the wafer W is rotating, any area of the first surface 1 of the wafer W passes over one of the polishing blades 55. Thus, the polishing blades 55 can press the polishing tapes 31 against the entirety of the first surface 1 of the wafer W.

An additional polishing blade(s) 55' may be disposed at the same distance from the axis CP as the distance of one of the polishing blades 55 from the axis CP. A certain area of the first surface 1 of the wafer W passes over the two blades, namely the additional polishing blade 55' and the polishing blade 55 located at the same radial position. As a result, the polishing rate in that area increases. In the embodiment shown in FIG. 33, two additional polishing blades 55' are disposed at the same radial positions as those of the outer two polishing blades 55. Therefore, the peripheral area of the first surface 1 of the wafer W is polished at a higher polishing rate than that in the central area.

Figure 34:
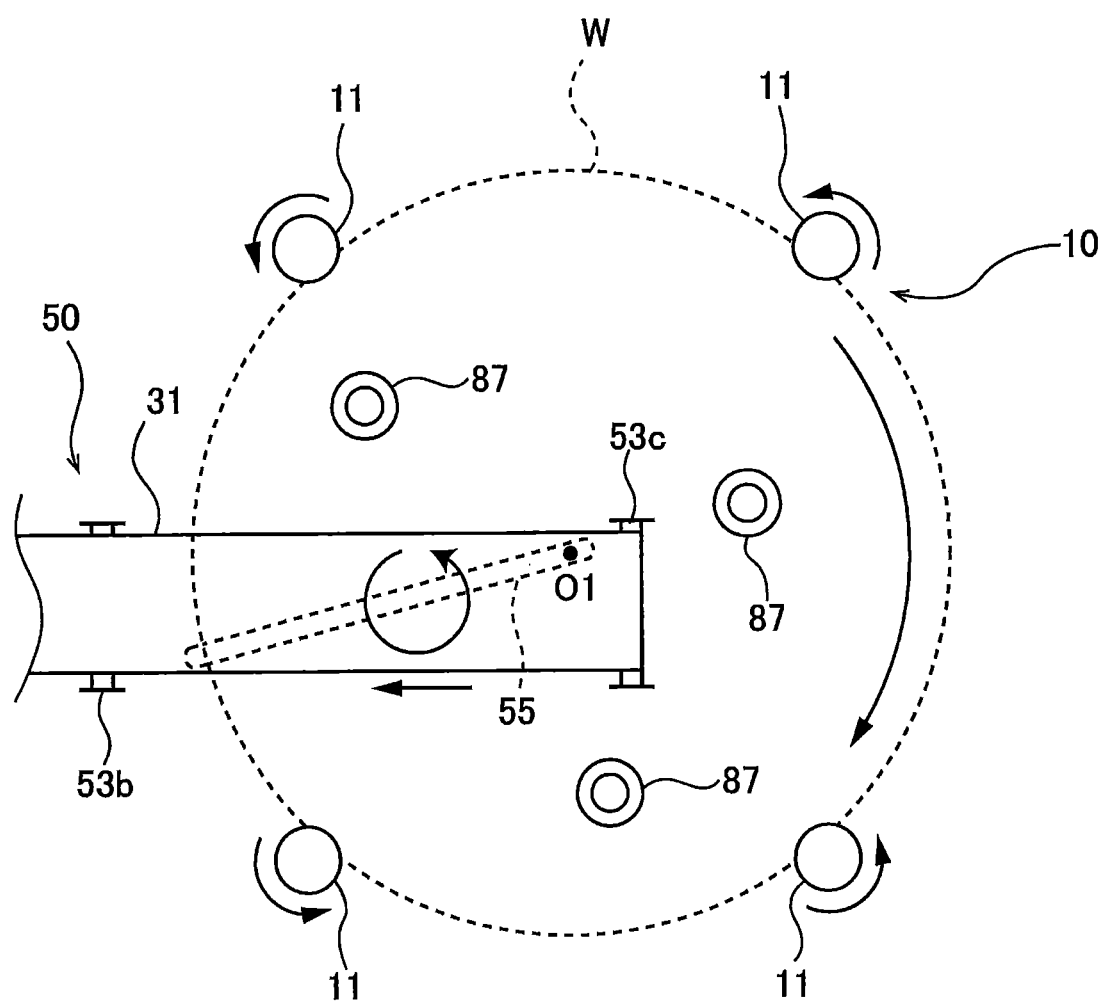
FIG. 34 is a plan view schematically showing another embodiment of a polishing apparatus.

FIG. 34 is a plan view schematically showing another embodiment of a polishing apparatus. The construction and operation of this embodiment, not particularly described here, are the same as those of the embodiments described above with reference to FIGS. 1 through 33, and therefore a duplicate description thereof will be omitted. The polishing apparatus of this embodiment includes at least one Bernoulli chuck 87 for attracting the first surface 1 of the wafer W by means of a fluid in a non-contact manner. In the embodiment shown in FIG. 34, the polishing apparatus includes a plurality of Bernoulli chucks 87, while the number of Bernoulli chucks 87 may be one. The Bernoulli chuck 87 is defined herein as a chuck which uses the Bernoulli's theorem to generate a suction force.

Figure 35:
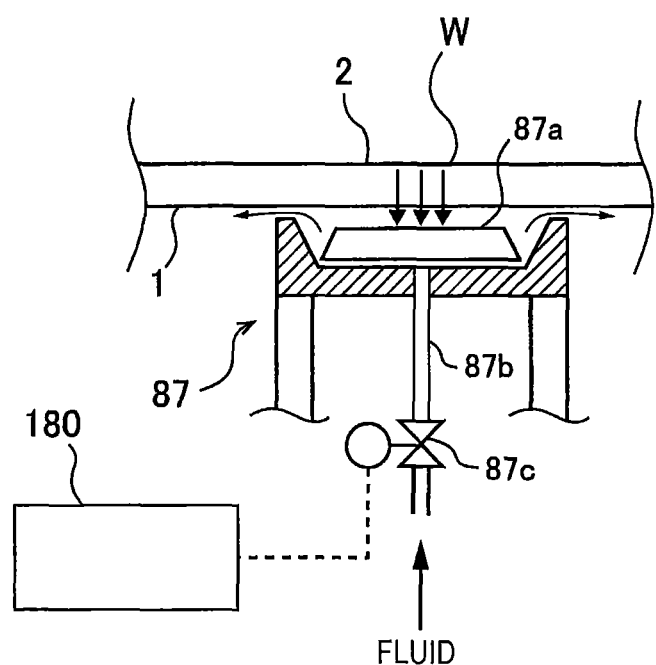
FIG. 35 is a schematic view showing one of Bernoulli chucks.

FIG. 35 is a schematic view of one of the Bernoulli chucks 87. The Bernoulli chucks 87 are disposed below the substrate-holding surfaces 11a (see FIGS. 5 and 6), and have suction surfaces 87a facing upward. Each Bernoulli chuck 87 includes a fluid supply tube 87b for supplying a fluid (e.g. a gas, such as dry air or an inert gas, or a liquid, such as pure water) to the suction surface 87a, and an actuator-driven valve 87c attached to the fluid supply tube 87b. The actuator-driven valve 87c is electrically connected to the operation controller 180, so that the operation of the actuator-driven valve 87c is controlled by the operation controller 180. Examples of the actuator-driven valve 87c include a motor-driven valve and a solenoid valve.

When the operation controller 180 opens the actuator-driven valve 87c, the fluid flows through the fluid supply tube 87b, and is ejected outwardly from a periphery of the suction surface 87a, thereby creating a negative pressure in a space between a central portion of the suction surface 87a and the first surface 1 of the wafer W. The Bernoulli chuck 87 thus generates a suction force in the central portion of the suction surface 87a and attracts the wafer W. Since the flow of the fluid is formed in the space between the peripheral portion of the suction surface 87a and the first surface 1 of the wafer W, the Bernoulli chuck 87 can attract the wafer W in a non-contact manner. When the Bernoulli chucks 87 are attracting the wafer W, the rollers 11 of the substrate holder 10 can rotate the wafer W.

When the first surface 1 of the wafer W is polished with the polishing tape 31 pressed against the first surface 1, an upward polishing load is applied to the wafer W. In this embodiment, a downward suction force is applied to the wafer W by the Bernoulli chucks 87. This downward suction force cancels the upward load applied to the wafer W. Therefore, the polishing head 50 can apply the polishing load to the first surface 1 of the wafer W while preventing the wafer W from bending. Further, since the wafer W is attracted to the suction surfaces 87a of the Bernoulli chucks 87 in a non-contact manner, the first surface 1 of the wafer W can be kept clean. The construction of this embodiment can be applied to the embodiments described above with reference to FIGS. 1 through 33.

Figure 36:
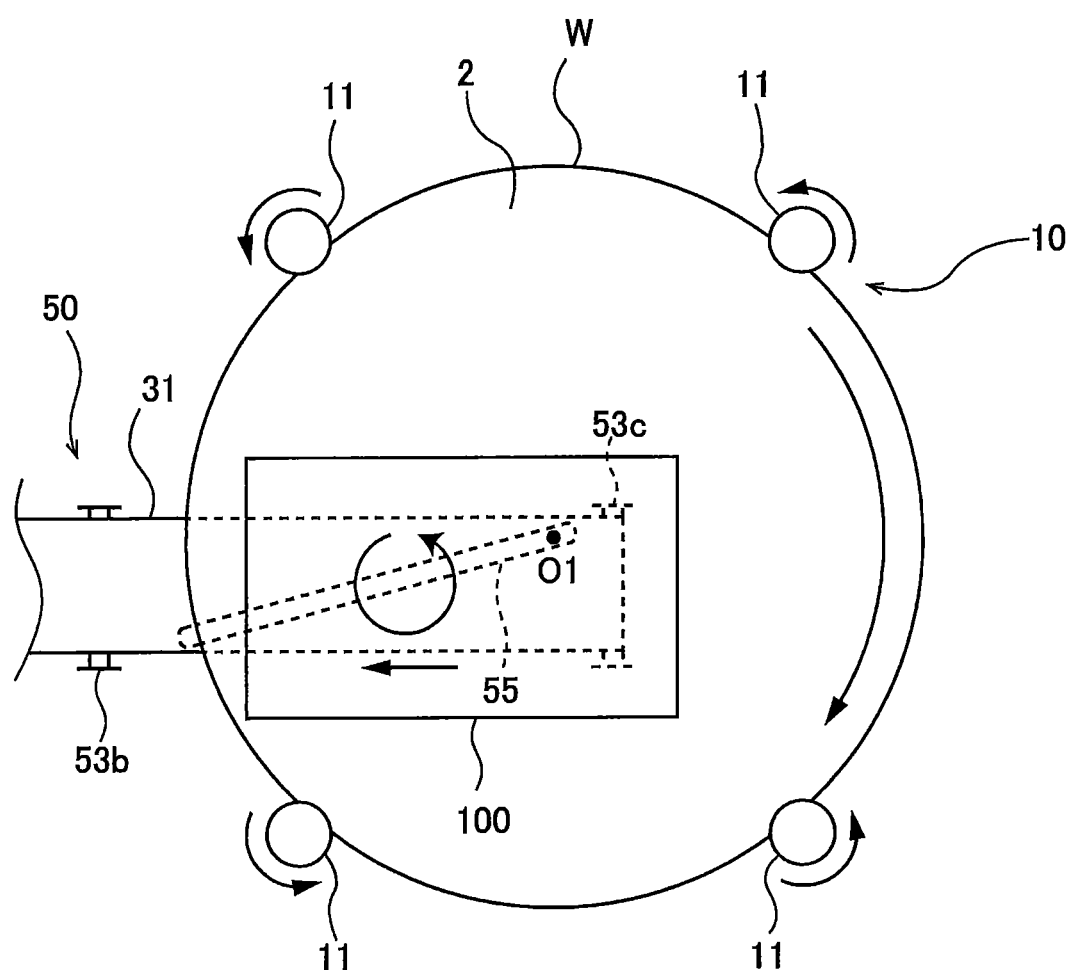
FIG. 36 is a plan view schematically showing another embodiment of a polishing apparatus.
Figure 37:
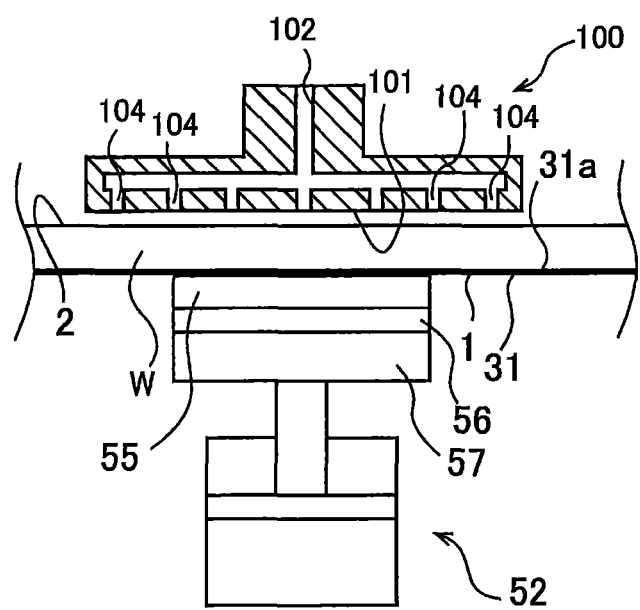
FIG. 37 is a diagram of a hydrostatic support stage shown in FIG. 36 as viewed from a lateral direction.

FIG. 36 is a plan view schematically showing another embodiment of a polishing apparatus, and FIG. 37 is a diagram showing a hydrostatic support stage 100 of FIG. 36 as viewed from a lateral direction. The construction and operation of this embodiment, not particularly described here, are the same as those of the embodiments described above with reference to FIGS. 1 through 33, and therefore a duplicate description thereof will be omitted. The polishing apparatus of this embodiment includes the hydrostatic support stage 100 for supporting the second surface 2 of the wafer W through a fluid in a non-contact manner.

The hydrostatic support stage 100 is an embodiment of a substrate support stage for supporting the second surface 2 (opposite the first surface 1) of the wafer W held by the rollers 11. In this embodiment, the hydrostatic support stage 100 is configured to bring a fluid into contact with the second surface 2 of the wafer W held by the rollers 11 so as to support the wafer W with the fluid. The hydrostatic support stage 100 has a substrate support surface 101 to be located close to the second surface 2 of the wafer W held by the rollers 11. The hydrostatic support stage 100 further has a plurality of fluid ejection openings 104 formed in the substrate support surface 101, and a fluid supply passage 102 connected to the fluid ejection openings 104. The hydrostatic support stage 100 is disposed above the wafer W, held by the substrate holder 10, with the substrate support surface 101 spaced slightly apart from the second surface 2 of the wafer W. The fluid supply passage 102 is coupled to a not-shown fluid supply source. The substrate support surface 101 of this embodiment has a quadrangular shape, while the substrate support surface 101 may have a circular shape or other shape.

The hydrostatic support stage 100 supplies the fluid (e.g. a liquid such as pure water) through the fluid supply passage 102 to the fluid ejection openings 104, and fills a space between the substrate support surface 101 and the second surface 2 of the wafer W with the fluid. The wafer W is supported by the fluid existing between the substrate support surface 101 and the second surface 2 of the wafer W.

The polishing surface 31a of the polishing tape 31 and the substrate support surface 101 of the hydrostatic support stage 100 are arranged symmetrically with respect to the wafer W. Thus, the polishing surface 31a of the polishing tape 31 and the substrate support surface 101 of the hydrostatic support stage 100 are located such that the wafer W is sandwiched therebetween. With this arrangement, the upward load, applied to the wafer W by the polishing head 50, is supported by the hydrostatic support stage 100 from just above the polishing head 50.

Therefore, the polishing head 50 can apply the polishing load to the first surface 1 of the wafer W while preventing deflection of the wafer W. Further, since the hydrostatic support stage 100 supports the second surface 2 of the wafer W with the fluid in a non-contact manner, the second surface 2 of the wafer W can be kept clean. A liquid such as pure water, which is an incompressible fluid, or a gas such as air or nitrogen gas, which is a compressible fluid, may be used as the fluid for the hydrostatic support stage 100. In the case of using pure water, a pure water supply line, provided in a factory in which the polishing apparatus is installed, can be used as the fluid supply source coupled to the fluid supply passage 102. The construction of this embodiment can be applied to the embodiments described above with reference to FIGS. 1 through 33. The hydrostatic support stage 100 is electrically connected to the operation controller 180, so that the operation of the hydrostatic support stage 100 is controlled by the operation controller 180.

Figure 38:
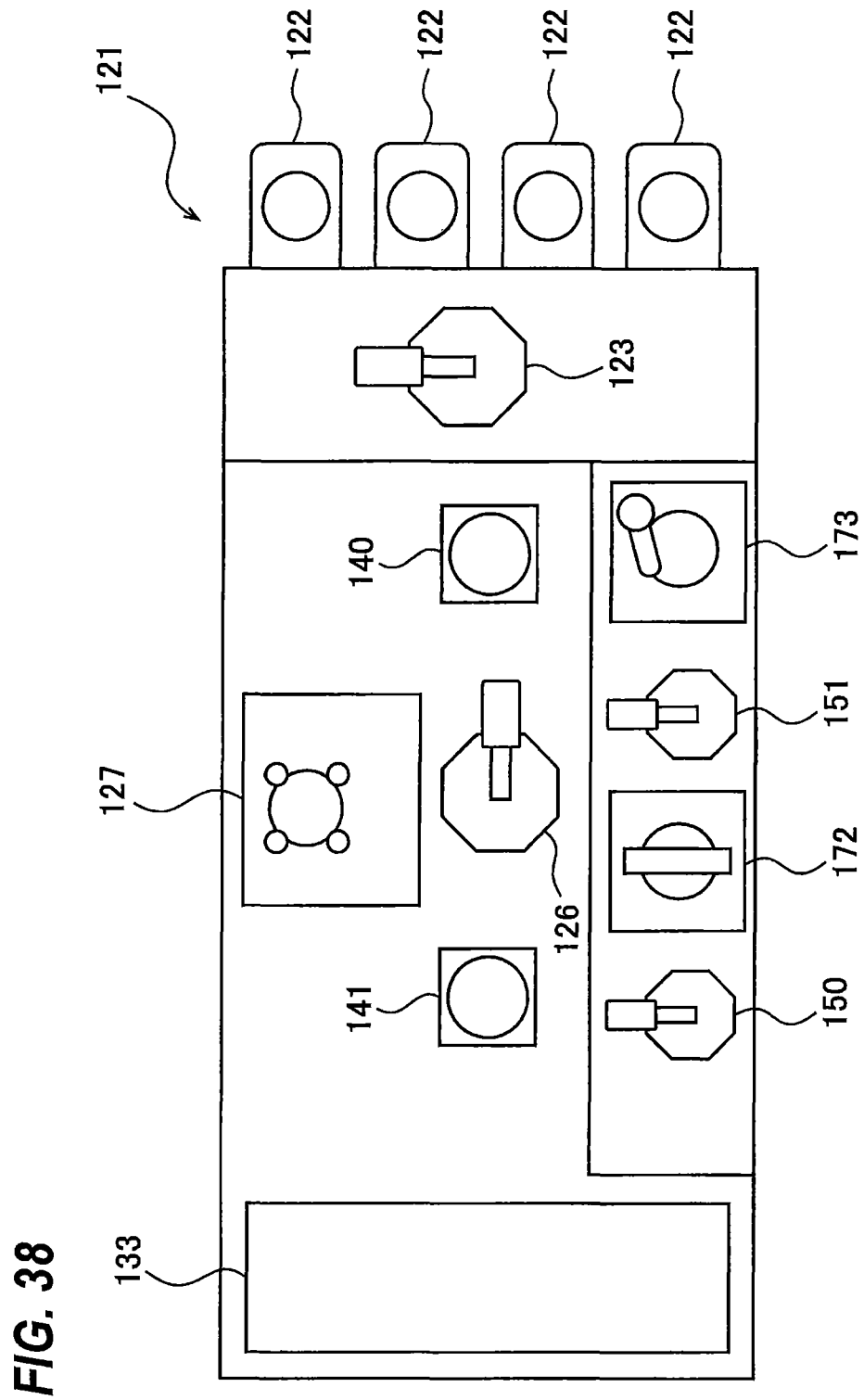
FIG. 38 is a plan view schematically showing an embodiment of a substrate processing system provided with a polishing apparatus.

FIG. 38 is a plan view schematically showing an embodiment of a substrate processing system provided with one of the above-described polishing apparatuses. In this embodiment, the substrate processing system includes a loading and unloading section 121 including a plurality of load ports 122 on which wafer cassettes (or substrate cassettes) are set. A large number of wafers are housed in each of the wafer cassettes. Each load port 122 can be equipped with an open cassette, a SMIF (Standard Manufacturing Interface) pod or a FOUP (Front Opening Unified Pod). The SMIF and the FOUP are each an airtight container which houses a wafer cassette therein and which, by covering it with a partition wall, can keep the internal environment independent of the external environment.

A first transport robot (or a loader) 123, which is movable along an arrangement direction of the load ports 122, is installed in the loading and unloading section 121. The first transport robot 123 can access each wafer cassette set in each load port 122 and can take a wafer out of the wafer cassette.

The substrate processing system further includes a second transport robot 126 which is movable in a horizontal direction, a first temporary placement stage 140 on which a wafer is temporarily placed, a second temporary placement stage 141 on which a wafer is temporarily placed, a polishing unit 127, a system controller 133 for controlling overall operations of the substrate processing system, a cleaning unit 172 for cleaning a polished wafer, and a drying unit 173 for drying a cleaned wafer. A third transport robot 150 for transporting a wafer is disposed between the second temporary placement stage 141 and the cleaning unit 172, and a fourth transport robot 151 for transporting a wafer is disposed between the cleaning unit 172 and the drying unit 173. The polishing unit 127 is one of the above-described polishing apparatuses.

A description will now be given of a transport route for a wafer when the wafer is to be polished in the polishing unit 127. A plurality of (e.g. 25) wafers, with their device surfaces facing upward, are housed in the wafer cassette (substrate cassette) that has been set on the load port 122. The first transport robot 123 takes a wafer out of the wafer cassette, and places the wafer on the first temporary placement stage 140. The second transport robot 126 removes the wafer from the first temporary placement stage 140, and transports the wafer, with its back surface facing downward, to the polishing unit 127. The back surface of the wafer is polished in the polishing unit 127 in the above-described manner. The second transport robot 126 removes the polished wafer from the polishing unit 127, and places the wafer on the second temporary placement stage 141. The third transport robot 150 removes the wafer from the second temporary placement stage 141, and transports the wafer to the cleaning unit 172.

The wafer, with the polished back surface facing downward, is cleaned by the cleaning unit 172. In one embodiment, the cleaning unit 172 includes an upper roll sponge and a lower roll sponge, disposed such that they sandwich a wafer therebetween, and cleans both surfaces of the wafer with these roll sponges while supplying a cleaning liquid to both surfaces of the wafer.

The fourth transport robot 151 removes the cleaned wafer from the cleaning unit 172, and transports the wafer to the drying unit 173. The wafer, with the cleaned back surface facing downward, is dried by the drying unit 173. In this embodiment, the drying unit 173 is configured to spin-dry a wafer by rotating it about its axis at a high speed. In one embodiment, the drying unit 173 may be of an IPA type which dries a wafer by supplying pure water and an IPA vapor (mixture of isopropyl alcohol and N2 gas) to a lower surface of the wafer from a pure water nozzle and an IPA nozzle while moving the pure water nozzle and the IPA nozzle in a radial direction of the wafer.

The dried wafer, with its back surface facing downward, is returned to the wafer cassette on the load port 122 by the first transport robot 123. In this manner, the substrate processing system can perform a sequence of steps including polishing, cleaning, and drying of a wafer, and transporting of the wafer to the loading and unloading section, while keeping the back surface of the wafer facing downward.

According to this embodiment, the entirety of the back surface of the wafer can be efficiently polished, with the back surface facing downward. As a result, there is no need to reverse the wafer for polishing of the back surface. This can prevent impurities in the air from adhering to the wafer and can reduce the overall processing time. Moreover, because of no need for an edge-polishing unit and a reversing machine for reversing a wafer, the construction of the substrate processing system can be simplified and the cost can be reduced. In one embodiment, the substrate processing system may include one more polishing unit 127 instead of an edge-polishing unit which is now unnecessary. The use of two polishing units 127 can double the number of wafers processed per unit time, thus increasing the throughput.

The above-described polishing apparatuses can all polish the entirety of the first surface 1, including the outermost area, of the wafer W without causing contact between the polishing head 50 and the rollers 11 of the substrate holder 10. Therefore, there is no need to polish the outermost area of the first surface 1 of the wafer W with use of an edge-polishing unit. As a result, the number of polishing steps can be reduced.

Further, the polishing head 50 of each of the above-described polishing apparatuses is disposed at the lower side of the wafer W, and the polishing apparatus polishes the first surface 1 of the wafer W while causing the polishing head 50 or the substrate holder 10 to make a translational rotating motion. Therefore, the polishing apparatus can efficiently polish the first surface 1 of the wafer W, with the first surface 1 facing downward. Therefore, there is no need to reverse the wafer W for polishing of the back surface. This can prevent impurities in the air from adhering to the wafer W and can reduce the overall processing time.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus comprising:
   a substrate holder configured to hold a substrate and rotate the substrate, the substrate holder including a plurality of rollers which are rotatable about their own axes, the plurality of rollers having substrate-holding surfaces capable of contacting a periphery of the substrate;
   a polishing head configured to bring a polishing tape, having abrasive particles on one surface, into contact with a back surface of the substrate to polish the back surface, the polishing head being disposed below the substrate-holding surfaces, the polishing head including a plurality of polishing blades configured to press the polishing tape against the back surface of the substrate, and a plurality of pressing mechanisms a pressing mechanism configured to push the plurality of polishing blades upward, respectively, the plurality of pressing mechanisms being configured to operate independently of each other, the plurality of polishing blades including a first polishing blade and second polishing blades, a distance from an axis of the substrate holder to the second polishing blades being larger than a distance from the axis of the substrate holder to the first polishing blade, the second polishing blades being located at the same distance from the axis of the substrate holder, the second polishing blades extending in different directions;
   a tape advancing device configured to advance the polishing tape in its longitudinal direction; and
   a translational rotating mechanism configured to cause the polishing head to make a translational rotating motion.

2. The polishing apparatus according to claim 1, wherein the first polishing blade and the second polishing blades extend obliquely with respect to an advancing direction of the polishing tape.

3. The polishing apparatus according to claim 1, wherein the polishing head includes a first spherical bearing which tiltably supports the first polishing blade and a second spherical bearing which tiltably supports the second polishing blades.

4. The polishing apparatus according to claim 1, wherein the polishing head has a first soft material that covers a top edge of the first polishing blade and second soft materials that cover top edges of the second polishing blades.

5. The polishing apparatus according to claim 1, further comprising a polishing-head moving mechanism configured to translate the polishing head.

6. The polishing apparatus according to claim 1, wherein the second polishing blades are arranged symmetrically with respect to an advancing direction of the polishing tape.

7. The polishing apparatus according to claim 1, wherein a distance between the second polishing blades increases according to a distance from the axis of the substrate holder.

8. The polishing apparatus according to claim 1, wherein a distance from the axis of the substrate holder to outermost ends of the second polishing blades is larger than a distance from the axis of the substrate holder to the substrate-holding surfaces of the plurality of rollers.

9. A polishing apparatus comprising:
   a substrate holder configured to hold a substrate and rotate the substrate, the substrate holder including a plurality of rollers which are rotatable about their own axes, the plurality of rollers having substrate-holding surfaces capable of contacting a periphery of the substrate;

a polishing head configured to bring a polishing tape into contact with a back surface of the substrate to polish the back surface, the polishing head being disposed below the substrate-holding surfaces, the polishing head including a plurality of polishing blades configured to press the polishing tape against the back surface of the substrate, and a plurality of pressing mechanisms configured to push the plurality of polishing blades upward, respectively, the plurality of pressing mechanisms being configured to operate independently of each other, the plurality of polishing blades including a first polishing blade and second polishing blades, a distance from an axis of the substrate holder to the second polishing blades being larger than a distance from the axis of the substrate holder to the first polishing blade, the second polishing blades being located at the same distance from the axis of the substrate holder, the second polishing blades extending in different directions; and a translational rotating mechanism configured to cause the substrate holder to make a translational rotating motion.

10. The polishing apparatus according to claim 9, wherein the first polishing blade and the second polishing blades extend obliquely with respect to an advancing direction of the polishing tape.

11. The polishing apparatus according to claim 9, wherein the polishing head includes a first spherical bearing which tiltably supports the first polishing blade and a second spherical bearing which tiltably supports the second polishing blades.

12. The polishing apparatus according to claim 9, wherein the polishing head has a first soft material that covers a top edge of the first polishing blade and second soft materials that cover top edges of the second polishing blades.

13. The polishing apparatus according to claim 9, wherein the polishing head comprises a plurality of polishing heads.

14. The polishing apparatus according to claim 9, wherein the second polishing blades are arranged symmetrically with respect to an advancing direction of the polishing tape.

15. The polishing apparatus according to claim 9, wherein a distance between the second polishing blades increases according to a distance from the axis of the substrate holder.

16. The polishing apparatus according to claim 9, wherein a distance from the axis of the substrate holder to outermost ends of the second polishing blades is larger than a distance from the axis of the substrate holder to the substrate-holding surfaces of the plurality of rollers.

* * * * *